United States Patent [19]
Suzuki et al.

[11] Patent Number: 5,116,670
[45] Date of Patent: May 26, 1992

[54] ALLYL ESTER RESIN COMPOSITION AND LAMINATED SHEET USING THE SAME

[75] Inventors: Noboru Suzuki; Masaharu Yoshida; Satoshi Noda; Minoru Takaishi; Kenichiro Takiguchi; Hiroshi Uchida; Takeshi Onoda, all of Kanagawa, Japan

[73] Assignee: Showa Denko K.K., Tokyo, Japan

[21] Appl. No.: 589,578

[22] Filed: Sep. 28, 1990

[30] Foreign Application Priority Data

| Sep. 29, 1989 | [JP] | Japan | 1-255038 |
| Jan. 11, 1990 | [JP] | Japan | 2-4078 |
| Mar. 15, 1990 | [JP] | Japan | 2-65214 |
| Mar. 15, 1990 | [JP] | Japan | 2-65215 |
| May 1, 1990 | [JP] | Japan | 2-115472 |

[51] Int. Cl.$^5$ .................. D03D 3/00; D03D 15/00; D03D 17/00; D03D 25/00
[52] U.S. Cl. .................. 428/285; 428/287; 428/290; 428/416; 428/431; 428/443; 428/458; 428/460; 428/464; 428/481; 428/482; 428/901; 528/272; 528/308; 526/322
[58] Field of Search .................. 428/224, 278, 475.8; 528/272, 308; 526/322

[56] References Cited

U.S. PATENT DOCUMENTS

| 4,751,146 | 6/1988 | Maeda et al. | 428/475.8 |
| 4,959,451 | 9/1990 | Uchida et al. | 528/272 |
| 5,003,020 | 3/1991 | Uchida et al. | 526/322 |

FOREIGN PATENT DOCUMENTS 0013808  9/1965  Japan.

Primary Examiner—George F. Lesmes
Assistant Examiner—Richard C. Weisberger
Attorney, Agent, or Firm—Sughrue, Mion, Zinn, Macpeak & Seas

[57] ABSTRACT

Resin compositions for laminated sheets and laminated sheets produced therefrom are disclosed, the compositions comprising at least one allyl ester resin composed of a polybasic acid and a polyhydric alcohol, wherein an allyl ester group of said resin is bonded to at least one of terminals thereof.

23 Claims, No Drawings

ALLYL ESTER RESIN COMPOSITION AND LAMINATED SHEET USING THE SAME

FIELD OF THE INVENTION

This invention relates to allyl ester resin compositions useful for the production of laminated sheets used in electrical equipment, electronic equipment, communication equipment and other equipment and to laminated sheet produced by using such allyl ester resin compositions.

BACKGROUND OF THE INVENTION

Conventionally well-known laminated sheets include paper base phenolic resin laminated sheets, paper base unsaturated polyester resin laminated sheets, and glass-cloth base epoxy resin laminated sheets These laminated sheets have been produced by impregnating the respective base with a resin and heat-curing a plurality of the resulting prepregs. The term "laminated sheet" as used herein means a laminated sheet having a thickness of from 0.5 to 5 mm which is used, for example, as a base of various electronic parts.

During the production of phenolic resin laminated sheets, curing of a phenolic resin is accompanied by the forming of reaction by-products, such as water, which adversely affect physical properties of the resulting laminated sheet. To avoid this, it is necessary to forcedly dissolve water, etc. in the cured product by applying a high pressure by means of a large-sized pressing machine or other machine suitable for applying high pressure to such a cured laminate. Phenolic resins generally require a long time for curing, and the additional application of high pressure also requires additional prolonged periods of time. Moreover, laminated sheets comprising phenolic resins are inferior to alternative component resins in electrical characteristics, such as dielectric constant, dielectric dissipation factor, tracking resistance, and other relevant characteristics.

During the production of glass-cloth base epoxy resin laminated sheets, on the other hand, high pressures required for production of phenolic resin laminated sheets are not necessary, since the curing reaction is not accompanied by formation of by-products, (e.g., water), as is observed with a condensation reaction of phenolic resins. Nevertheless, curing of epoxy resins still requires long periods of time.

In order to solve these above-mentioned problems, it has been proposed to produce laminated sheets using paper as a base and an unsaturated polyester resin as an impregnating resin. According to this process, since curing is effected through radical polymerization, the time required for curing is reduced to thereby eliminate the above-described disadvantages. However, unsaturated polyester resins have poor heat resistance which results in laminated sheets exhibiting low stiffness and strength under elevated temperatures.

SUMMARY OF THE INVENTION

Therefore, an object of this invention is to provide composition resins and laminated sheets comprising such resin compositions which require short periods of time for curing and which are useful as components of laminated sheets having satisfactory physical properties, such as stiffness and strength at high temperatures.

Another object of this invention is to provide resin compositions which can be used to produce a laminated sheets having suitable physical properties, such as stiffness and strength at high temperatures, which can be produced without using a prepreg method.

A further object of this invention is to provide radical curable resin compositions for laminated sheets and such laminated sheets which can comprise laminated sheets for used e.g., as electrical parts, which have high flame retardancy combined with superior heat resistance.

Still another object of this invention is to provide resin compositions for laminated sheets and such laminated sheets, both having satisfactory mechanical characteristics, and satisfactory punchability at about room temperature, as well as high stiffness at high temperatures with superior productivity.

In accomplishing the foregoing objects, there has been provided, in accordance with one aspect of the present invention, a laimnated sheet produced by impregnating a base with (i) a resin composition comprising at least one allyl ester resin comprising a polybasic acid and a polyhydric alcohol, wherein the allyl ester group of said resin is bonded to the terminal of the resin or (ii) a resin solution comprising said resin composition and a solvent, followed by curing.

DETAILED DESCRIPTION OF THE INVENTION

It has been discovered that the above-described problems associated with the production of paper base phenolic resin laminated sheets or glass-cloth base epoxy resin laminated sheets can be solved by using a resin composition (or solution) comprising at least one allyl ester resin dissolved in a solvent or a crosslinking monomer. The use of the resin compositions, according to the present invention, provide laminated sheets having improved high temperature physical properties as compared to laminated sheets produced by using unsaturated polyester resins, and improved electrical characteristics as compared to those produced by using phenolic resins.

Allyl ester resins which can be used according to the present invention include a polyester resins comprising a polybasic acid and a polyhydric alcohol and having an allyl ester group attached to at least one of the polyester terminals of the polyester resin.

Examples of polybasic acids, used in the polyester resin of the present invention, include dibasic acids, such as phthalic acids (e.g., o-phthalic acid, o-phthalic anhydride, isophthalic acid, and terephthalic acid), hydrophthalic acids (e.g., tetrahydrophthalic acid, methyltetrahydrophthalic acid, endomethylenetetrahydrophthalic acid, methylendomethyl-enetetrahydrophthalic acid, hexahydrophthalic acid, methylhexahydrophthalic acid, and anhydrides of these acids), aliphatic dibasic acids (e.g., malonic acid, succinic acid, glutaric acid, and adipic acid), and halogenated dibasic acids (e.g., tetrabromophthalic acid, tetrachlorophthalic acid, chlorendic acid, and anhydrides of these acids); and tri- or polyfunctional polybasic acids, such as trimellitic acid, pyromellitic acid, and anhydrides thereof. These polybasic acids may be used either undividually or as a combination of two or more thereof.

Examples of polyhydric alcohol which can be used in the present invention include aliphatic, alicyclic or aromatic dihydric alcohols, e.g., ethylene glycol, 1,2-propylene glycol, 1,4-butanediol, 1,6-hexanediol, neopentyl glycol, 1,4-cyclohexanedimethanol, and p-xylene glycol; and dihydric alcohols represented by formula:

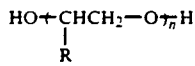

wherein R represents a hydrogen atom or a straight chain alkyl group, preferably having from 1 to 5 carbon atoms; and n represents an integer of from 2 to 10, which are obtained by addition reaction of an alkylene oxide, e.g., ethylene oxide and propylene oxide. Examples of tri- or higher polyhydric alcohols include aliphatic trihydric alcohols, e.g., glycerin and trimethylolpropane, and tetra- or higher polyhydric alcohols, e.g., pentaerythritol and sorbitol. In addition, halogenated aliphatic, alicyclic or aromatic polyhydric alcohols, e.g., dibromoneopentyl glycol and an ethylene oxide or propylene oxide adduct of tetrabromobisphenol A, can also be used. These polyhydric alcohols can be used either individually or as a combination of two or more thereof.

Methods useful for preparing allyl ester resins of the present invention are not particularly limited, and known methods can be used e.g., as described in Japanese Patent Application No. 63-262217, the contents of which are herein incorporated by reference. For example, allyl ester resins of the present invention can be prepared by reacting a diallyl ester of a dibasic acid, (e.g., diallyl terephthalate,) and a polyhydric alcohol in the presence of an interesterification catalyst while removing allyl alcohol by distillation. In processes more suitable for industrial use, a dialkyl ester of a dibasic acid, e.g., dimethyl terephthalate, and an allyl alcohol are used in place of diallyl terephthalate and charged in a reactor together with an interesterification catalyst and are allowed to react while removing alcohol by products, (e.g., methanol) by distillation. Depending on the reaction temperature, a polymerization inhibitor (e.g., hydroquinone) may be added to the reaction system. Allyl ester resins having an allyl group at one or both of the polyester terminals can thus be obtained Such allyl ester resin may be used either individually or in combination of two or more thereof.

Various kinds of allyl ester resins can be obtained by varying the types of polybasic acids and polyhydric alcohols used, and preferably, most suitable allyl ester resins are selected. Using the resulting allyl ester resins as impregnating resins, laminated sheets for electrical parts having satisfactory electrical characteristics, punchability, and flame retardancy, while retaining heat resistance can be produced according to the present invention.

Flame retardancy of allyl ester resins of the present invention can may be enhanced by incorporating halogen atoms into the resin skeleton. Halogenated allyl ester resins (i.e., halogen-containing allyl ester resins) exert desirable self-extinguishing properties. In addition, since a bromine or chlorine atom is bonded to the skeleton of heat-resistant allyl ester resins, thermal deterioration (in mechanical strength, dielectric strength and other suitable physical properties) that frequently occur when flame retardant additives are used, can be minimized to provide superior laminated sheets of the present invention for electrical parts. Further, such resins of this invention used for producing laminated sheets also of the present invention can be appropriately selected according to the desired performance properties of these laminated sheets to be produced.

The term "halogen-containing allyl ester resin", as used herein, means an allyl ester resin comprising a saturated polybasic acid comprising of bromine or chlorine and/or a saturated polyhydric alcohol comprising bromine or chlorine. Saturated polybasic acids comprising bromine or chlorine include at least one of the above-mentioned saturated polybasic acids, substituted with one or more bromine or chlorine atoms, and can include, for example, tetrabromophthalic acid, tetrachlorophthalic acid, chlorendic acid, and anhydrides of these acids. Saturated polyhydric alcohols comprising bromine or chlorine include at least one of the above-mentioned saturated polyhydric alcohols substituted with one or more bromine or chlorine atoms, and can include, for example, dibromoneopentyl glycol and an ethylene oxide or propylene oxide adducts of tetrabromobisphenol A.

Halogen-containing allyl ester resins of the present invention are prepared from at least one saturated polybasic acid comprising bromine or chlorine and/or at least one saturated polyhydric alcohol comprising bromine or chlorine. Saturated polybasic acids comprising no bromine or chlorine and/or a saturated polyhydric alcohols comprising no bromine or chlorine may also be used in combination with these polybasic acids ane polyhydue alcohols comprising halogens.

In general, the above-described allyl ester resins and halogen-containing allyl ester resins (hereinafter inclusively referred to allyl ester resins) can be solid or have a high viscosity and therefore have a low degree of impregnation by a base. Therefore, allyl ester resins be used dissolved in a solvent.

Solvents which can be used for dissolving allyl ester resins of the present invention are not particularly limited as long as they can dissolve the allyl ester resins and preferably include those which are evaporated at relatively low temperatures. Examples of suitable solvents include hydrocarbons (e.g., cyclohexane, benzene, toluene, and xylene); ketones (e.g., acetone, methyl ethyl ketone and methyl isobutyl ketone); esters (e.g., methyl acetate, ethyl acetate, butyl acetate, and lactone); and ethers (e.g. methyl butyl ether, dioxane, and tetrahydrofuran). Such solvents may be used either individually or in combination of two or more thereof.

Allyl ester resins of the present invention can be dissolved in a solvent by, for example, stirring at about room temperature or at a higher temperatures in order to increase the rate of dissolution.

Catalysts for radical curing can be added to allyl ester resin solutions of the invention. Radical curing catalysts preferably can include organic peroxides. In combination with or in place of the organic peroxides, known polymerization initiators, such as those sensitive to light and those sensitive to radiation or electron rays, can also be used.

Examples of suitable organic peroxides include ketone peroxides (e.g., cyclohexanone peroxide, methyl ethyl ketone peroxide, and acetylacetone peroxide); peroxy ketal (e.g., 1,1-bis(t-butylperoxy)-3,3,5-trimethylcyclohexane, 1,1-bis(t-butylperoxy)cyclohexane, 2,2-bis(t-butylperoxy)octane, 2,2-bis(t-butylperoxy)butane, and n-butyl 4,4-bis(t-butylperoxy)valerate); hydroperoxides (e.g., t-butyl hydroperoxide, cumene hydroperoxide, diisopropylbenzene hydroperoxide, p-menthane hydroperoxide, 2,5-dimethylhexane-2,5-dihydroperoxide, and 1,1,3,3-tetramethylbutyl hydroperoxide); dialkyl peroxides (e.g., di-t-butyl peroxide, t-butylcumyl peroxide, dicumyl peroxide, $\alpha,\alpha'$-bis(t-butylperoxy-m-isopropyl)benzene, 2,5-dimethyl-2,5-di(t- butylperoxy)hexane, and 2,5-dimethyl-2,5-di(t-butylperoxy)hexyne-3); diacyl peroxides (e.g., acetyl peroxide, iso-butyryl peroxide, octanoyl peroxide, decanoyl peroxide, lauroyl peroxide, succinic acid peroxide, 3,5,5-trimethylhexanoyl peroxide, benzoyl peroxide, m-toluoyl peroxide, and 2,4-dichlorobenzoyl peroxide); peroxy dicarbonates (e.g., di-iso-propylperoxy dicarbonate, di-2-ethylhexylperoxy dicarbonate, di-n-propylperoxy dicarbonate, dimyristylperoxy dicarbonate, di-2-ethoxyethylperoxy dicarbonate, dimethoxy-isopropylperoxy dicarbonate, di(3- methyl-3-methoxybutyl)peroxy dicarbonate, and diallylperoxy dicarbonate); and peroxy esters (e.g., t-butylperoxy acetate, t-butylperoxy iso-butyrate, t-butylperoxy pivalate, t-butylperoxy neodecanoate, cumylperoxy neodecanoate, t-butylperoxy 2-ethylhexanoate, t-butylperoxy 3,5,5-trimethylhexanoate, t-butylperoxy laurate, t-butylperoxy benzoate, di-t-butylperoxy iso-phthalate, 2,5-dimethyl-2,5-di(benzoylperoxy)hexane, t-butylperoxy isopropylcarbonate, cumylperoxy octoate, t-hexylperoxy neodecanoate, t-butylperoxy neodecanoate, t-hexylperoxy pivalate, t-hexylperoxy neohexanoate, and cumylperoxy neohexanoate.)

Such organic peroxides may be used either individually or as a combination of two or more thereof according to the type of resins and curing conditions used. Suitable curing catalysts preferably include the above-enumerated organic peroxides, but other curing catalysts may also be employed, according to the present invention.

As stated below, laminated sheets of the present invention can be produced by impregnating a base with at least one allyl ester resin dissolved in a solvent, removing the solvent from the impregnated base to form an intermediate called a prepreg, and laminating a plurality of prepregs at a high temperature under a high pressure (prepreg method). Impregnating resins comprising at least one allyl ester resin composition and a solvent which is used for the production of laminated sheets, according to the above-described prepreg method, will hereinafter be referred to a "resin solution".

If desired, resin solution may contain crosslinking monomers. Crosslinking monomers preferably include those having a higher boiling point than that of the solvent. Examples of suitable crosslinking monomers are diallyl o-phthalate, diallyl isophthalate, diallyl terephthalate, divinylbenzene, 2-ethylhexyl acrylate, 2-ethylhexyl methacrylate, lauryl acrylate, and lauryl methacrylate. Crosslinking monomers are preferably added in such an amount that a dried resin-impregnated base (i.e., a prepreg) after removal of the solvent and drying, has a reduced amount of tacky consistency.

If desired, solvents of resin solutions can be replaced with any known radical polymerizable crosslinking monomers having a carbon-carbon double bond. Examples of such crosslinking monomers include diallyl phthalates (e.g., diallyl o-phthalate, diallyl isophthalate, and diallyl terephthalate); styrene and its derivatives (e.g., styrene, α-methylstyrene, p-methylstyrene, p-chlorostyrene, bromostyrene, vinyltoluene, and divinylbenzene); acrylic or methacrylic esters (e.g., methyl (meth)acrylate, ethyl (meth)acrylate, butyl (meth)acrylate, 2-ethylhexyl (meth)acrylate, lauryl (meth)acrylate, benzyl (meth)acrylate, and brominated phenyl (meth)acrylate); carboxylic acid vinyl esters (e.g., vinyl acetate, vinyl propionate, and vinyl caproate); allyl acetate, vinyl chloride, acrylonitrile, or acrylamide; vinyl polyfunctional acrylates or methacrylates (e.g., ethylene glycol di(meth)acrylate, 1,4-butanediol di(meth)acrylate, trimethylolpropane tri(meth)acrylate, diacrylated isocyanurate, pentaerythritol tri(meth)acrylate, pentaerythritol tetra(meth)acrylate, glycerin di(meth)acrylate, neopentyl glycol di(meth)acrylate, and bisphenol A di(meth)acrylate); and vinyl polyfunctional oligoesters (e.g., polyurethane (meth)acrylate, poly ether (meth)acrylate, epichlorohydrin-modified bisphenol A di(meth)acrylate, ethylene oxide-modified bisphenol A di(meth)acrylate, polyethylene glycol di(meth)acrylate, and polypropylene glycol di(meth)acrylate).

In addition, polyfunctional crosslinking monomers containing an allyl group and at least one functional group other than an allyl group per molecule (e.g., allyl acrylate, allyl methacrylate, allyl acetate, allyl crotonate, allyl maleate, allyl itaconate, and allyl citraconate) can also preferably be used.

Such crosslinking monomers can be used either individually or in combination of two or more thereof. Incorporation of crosslinking monomers reduces the viscosity of allyl ester resins which are essentially solid resins or viscous liquids, making possible the production of laminated sheets directly from the resin compositions (containing no solvent) without passing through the state of a prepreg, thus simplifying the process for producing a laminated sheet.

In resin compositions of the present invention comprising crosslinking monomers, allyl ester resins are present in an amount of at least about 40% by weight, preferably from about 40 to 95% by weight, and more preferably from about 50 to 90% by weight; and the crosslinking monomer is preferably present in an amount less than about 60% by weight, and more preferably less than about 50% by weight. In particular, the content of a monofunctional crosslinking monomer preferably ranges from about 5 to 60% by weight, and more preferably from about 10 to 50% by weight.

If the allyl ester resin content is less than about 40% by weight, the crosslinking density is reduced, and the improvement in heat resistance is in sufficient. If the allyl ester resin content is greater than about 95%, the resin composition has an increased viscosity and is hard to handle in impregnation into a base.

Where the above-described polyfunctional crosslinking monomers, such as crosslinking monomers containing an allyl group and a radical polymerizable functional group other than an allyl group per molecule, is used as a part or all of the crosslinking monomer, the mechanical properties of the laminated sheet can be improved.

An ordinary crosslinking monomer which is generally considered hardly copolymerizable with allyl ester resins can . be made copolymerizable (co-curable) with allyl ester resins of the present invention, to a significant extent by using polyfunctional crosslinking monomers in combination therewith. Moreover, relative amounts of more expensive polyfunctional crosslinking monomers can be reduced by such a combined use.

Polyfunctional crosslinking monomers used in the production of a laminate of the present invention, such as a crosslinking monomer containing an allyl group and a radical polymerizable functional group other than an allyl group, are preferably used as a part of the whole crosslinking monomer (about 5 to 60% by weight based on the resin composition), i.e., in an amount of from about 1 to 30% by weight, preferably from about 1 to 20% by weight, based on the total resin composition. Less than about 1% by weight of the polyfunctional crosslinking monomer produces only a small effect of improving mechanical properties, such as strength Use of more than about 30% by weight is unfavorable in view of the cost.

Allyl ester resins have a relatively slow curing rate and also require a long time for heat curing in order to obtain a satisfactory laminated sheet. When, in particular, a base impregnated with the allyl ester resin is press molded, pressing for a short time followed by pressure release often fails to obtain satisfactory laminated sheets. Incorporation of polyfunctional (meth)acrylate compounds out of the above-enumerated radical polymerizable crosslinking monomers into resin compositions at the present invention makes it possible to achieve satisfactory pressing in a shortened time and is favorable from this viewpoint.

The term "polyfunctional (meth)acrylate compound" as used herein means a compound containing two or more acrylic ester groups or methacrylic ester groups per molecule. Specific but non-limiting examples of such a compound include polyfunctional acrylic or methacrylic esters, e.g., ethylene glycol di(meth)acrylate, propylene glycol di(meth)acrylate, 1,4-butanediol di(meth)acrylate, neopentyl glycol di(meth)acrylate, glycerin di(meth)acrylate, trimethylolpropane tri(meth)acrylate, pentaerythritol tri(meth)acrylate, pentaerythritol tetra(meth)acrylate, bisphenol A di(meth)acrylate, polyurethane di(meth)acrylate, polyether di(meth)acrylate, ethylene oxide-modified bisphenol A di(meth)acrylate, propylene oxide-modified bisphenol A di(meth)acrylate, epichlorohydrin-modified bisphenol A di(meth)acrylate, polyethylene glycol di(meth)acrylate, and polypropylene glycol di(meth)acrylate.

Thus, satisfactory laminated sheets of the present invention for electrical parts can be obtained by using allyl ester resin compositions having incorporated therein the above-described polyfunctional (meth)acrylate compounds through a simple process of heat-pressing a plurality of resin-impregnated bases for a short curing. More specifically, where a generally employed polymerization initiator is used with no polyfunctional (meth)acrylate compound, heat-pressing at about 130° to 150° C. for about 20 minutes is insufficient for proper curing and produces only laminated sheets which are expected to undergo deleterious whitening or delamination. In contrst, where polyfunctional (meth)acrylate compounds are incorporated into resin compositions of the present invention, satisfactory laminated sheets are produced that are free from whitening or delamination under the same curing conditions.

The type and amount of polyfunctional (meth)acrylate compound to be incorporated into resin compositions of the present invention are selected appropriately depending on the desired performance properties of the laminated sheets. This amount is preferably selected from the range of from about 1 to 30% by weight based on the total resin composition. With an amount of less than about 1% by weight, the curing rate is insufficient, and fails to obtain satisfactory laminated sheet in a short time. Use of greater than about 30% by weight of polyfunctional (meth)acrylate compounds results in production of laminated sheets that are too hard thereby having reduced punchability in templating, perforating, etc. The above-enumerated polyfunctional (meth)acrylate compounds may be used either individually or in combination of two or more thereof.

In order to meet the recent demand for high precision in position or size of cut out holes in the field of printed circuit boards and other electronic boards., it is prefered to conduct punching at temperatures in the vicinity of room temperature where errors due to heat shrinkage are reduced. Accordingly, there has been a demand for laminated sheets which can be punched at temperatures as close to room temperature as possible, that is, a laminated sheet having satisfactory punchability (i.e., freedom from cracking or bulging on punching) at about room temperature.

In this connection, it has been found that laminated sheets having satisfactory punchability at about room temperature, while retaining desirable high temperature physical properties, can be obtained by adjusting the glass transition temperature (Tg) of the cured product of resin compositions for laminated sheets of the present invention. The term "glass transition temperature (Tg)" as used herein means a value measured with a thermal mechanical analyser.

In the above-described embodiment, cured products of resin composition preferably have a Tg's ranging from about 20° to 90° C. If a resin composition, whose cured product has a Tg less than about 20° C., is used, resulting laminated sheets tend to undergo bulging on punching at about room temperatures. If the Tg of a cured product is higher than about 90° C., laminated sheets produced by using such resin compositions tend to undergo cracking on punching at about room temperature.

The Tg of a cured product of resin compositions for laminated sheets can be adjusted by appropriately selecting the types of polybasic acids and polyhydric alcohols, the molecular weight of allyl ester resins, and types and amounts of radical polymerizable crosslinking monomers.

Specific but non-limiting examples of resin compositions whose cured products have a Tg of from 20° to 90° C. are shown in Table 1 below.

TABLE 1

|  | 1 | 2 | 3 | 4 | 5 | 6 | 7 | 8 | 9 |
|---|---|---|---|---|---|---|---|---|---|
| Polyhydric Alcohol (mol %): | | | | | | | | | |
| Diethylene glycol | 33.3 | 40.0 | — | — | — | — | — | — | — |
| Triethylene glycol | — | — | 33.3 | — | — | — | — | — | — |
| Dipropylene glycol | — | — | — | 33.3 | — | — | — | — | — |
| 1,4-Butanediol | — | — | — | — | 33.3 | — | — | — | — |
| Propylene glycol | — | — | — | — | — | 33.3 | 33.3 | 33.3 | 33.3 |
| Polybasic Acid (mol %): | | | | | | | | | |
| Terephthalic acid | 66.6 | 60.0 | 66.6 | 66.6 | 66.6 | — | — | 66.6 | 66.6 |
| Adipic acid | — | — | — | — | — | 66.6 | — | — | — |
| Sebacic acid | — | — | — | — | — | — | 66.6 | — | — |
| Allyl ester of the above composition with an allyl group at both terminals thereof (wt %) | 80 | 80 | 80 | 80 | 80 | 80 | 80 | 65 | 60 |

TABLE 1-continued

|  | 1 | 2 | 3 | 4 | 5 | 6 | 7 | 8 | 9 |
|---|---|---|---|---|---|---|---|---|---|
| Crosslinking Monomer (wt %): | | | | | | | | | |
| Diallyl terephthalate | 20 | 20 | 20 | 20 | 20 | 20 | 20 | 15 | 10 |
| Butyl acrylate | — | — | — | — | — | — | — | 20 | 30 |

In Table 1 above, examples of amounts of polyhydric alcohols and polybasic acids are expressed in terms of mol% of each component in the polyester, and the compounding ratio of an allyl ester resin (obtained by introducing an allyl group to both terminals of the polyester comprising the polyhydric alcohol and polybasic acid shown) and crosslinking monomers is expressed as percent by weight. Resin Composition Nos. 1 to 7 are compositions in which the type of the polyhydric alcohol or polybasic acid is varied. Resin Composition Nos. 8 and 9 are those in which the type and amount of the crosslinking monomer are varied.

If desired, resin compositions or resin solutions containing allyl ester resins according to the present invention can further contain other radical curable resins. The term "other radical curable resins" as used herein means resins which contain an unsaturated bond and which are curable through chain polymerization by the action of a free radical, generated by heat, light or a catalyst. Examples of such resins include unsaturated polyester resins, vinyl ester resins, and diallyl phthalate resins.

If desired, resin compositions or resin solutions can further comprise flame retardants, colorants, parting agents, and fillers including various inorganic powders.

In the production of laminated sheets, treatment for rendering flame-retardance is of particular importance. Such treatment can be carried out by using flame-retarded halogen-containing allyl ester resins prepared by using halogenated saturated polybasic acids and/or halogenated saturated polyhydric alcohols, as mentioned above, or by using flame-retardants as an external additive.

Typical examples of such a flame-retardant include halogen-containing flame retardant compounds. Halogen-containing flame retardant compounds herein referred to are compounds which contain at least one bromine and/or chlorine atom per molecule and which do not undergo radical polymerization, including aliphatic, alicyclic, and aromatic hydrocarbon compounds. Specific but non-limiting examples of such halogen-containing, flame-retardont compounds include halogen-substituted benzenes (e.g., monobromobenzene, dibromobenzene, tribromobenzene, tetrabromobenzene, and bromochlorobenzene); halogen-substituted phenols (e.g., bromophenol, dibromophenol, tribromophenol, and pentabromophenol); halogen-substituted diphenyl ethers, (e.g., tetrabromodiphenyl ether, pentabromodiphenyl ether, hexabromodiphenyl ether, octabromodiphenyl ether, and decabromodiphenyl ether); tetrabromobisphenol A, ethylene oxide adducts of tetrabromobisphenol A, tetrachlorobisphenol A, brominated epoxy compounds, ethyl bromide, propyl bromide, butyl bromide, amyl bromide, hexyl bromide, octyl bromide, lauryl bromide, dibromopropane, dibromodecane, tetrabromomethane, tetrabromoethane, 1,2,3-tribromopropane, tetrabromobutane, hexabromocyclododecane, dibromoneopentyl glycol, dibromopropanol, epibromohydrin, bromotoluene, pentabromotoluene, bromoxylene, bromonaphthalene, chlorinated paraffin, chlorinated polyethylene, chlorinated polypropylene, perchloropentacyclodecane, chlorendic acid, tetrachlorophthalic anhydride, tetrabromophthalic anhydride, brominated polystyrene, and polydibromophenyl oxide. Such halogen-containing flame-retardant compounds may be used either individually or in combination of two or more thereof.

Where at least one halogen-containing flame-retardant compound is added to allyl ester resin compositions or resin solutions, of the present invention, a laminated sheet having superior properties for use in electrical parts or components etc. can be obtained not only because of the self-extinguishing properties attributed to bromine or chlorine but also because of the lack of thermal deterioration in dielectric strength and other descried physical properties, which have been accompanied by externally added flame-retardants. Thus the problems associated with the use of flame retardants can be solved by the combined use with heat resistant allyl ester resins, according to the present invention.

Mixing ratios of allyl ester resins and halogen-containing flame-retardant compounds in resin solutions or resin compositions of the present invention are appropriately determined, depending on the desired performance of laminated sheets. Usually, halogen-containing flame-retardant compounds are used in an amount of from about 15 to 80% by weight, and preferably from about 20 to 75% by weight, based on the total amount of allyl ester resins and halogen-containing flame-retardant compound. An amount exceeding about 80% by weight is disadvantageous for obtaining sufficient strength of laminated sheets. Amounts less than about 15% by weight lack sufficient flame retardancy. When copper-clad paper base laminated sheets are used, for example, where the resin content of laminated sheet is in the range from about 40 to 60% by weight based on the laminated sheet (excluding the weight of copper foil), it is preferable that the resin contains halogen-containing flame-retardant compounds in a proportion of at least about 4% by weight in an aliphatic bromine conversion to provide high flame retardancy and to obtain a laminated sheet having supevor mechanical and electrical characteristics for use in electrical electronic and communication parts and equipment.

Resin solutions or resin compositions of the present invention also can contain at least one phosphorus-containing flame-retardant in addition to allyl ester resins and halogen-containing flame-retardant compounds. Examples of suitable phosphorus-containing flame-retardants are trimethyl phosphate, triethyl phosphate, tributyl phosphate, trioctyl phosphate, triphenyl phosphate, tricresyl phosphate, tris(chloroethyl) phosphate, tris(dichloropropyl) phosphate, cresyldiphenyl phosphate, and triphenyl phosphite. Inorganic flame-retardants, such as antimony compounds (e.g., antimony trioxide and antimony pentoxide), zinc borate, aluminum hydroxide, and magnesium hydroxide, may also be employed in combination.

The above-described halogen-containing flame-retardants, phosphorus-containing flame-retardants, and inorganic flame-retardants are preferably used in a total amount of from about 10 to 80% by weight based on total resin composition.

Bases which can be used in laminated sheets of the present invention are those known and include, for example, bases made of glass fibers (e.g., glass fiber cloths and glass fabric); paper bases mainly comprising cellulosic fibers (e.g., kraft paper, linter paper, and cotton paper); and sheets or bands of inorganic fibrous materials (e.g., asbestos). In using paper bases, papers mainly comprising cellulose fibers having an air-dry density of from about 0.3 to 0.7 g/cm$^3$ (e.g., kraft paper), is preferred from the standpoint of impregnation properties and quality.

If desired, these bases to be impregnated with resin solutions or resin compositions can be subjected to pre-treatment by impregnating with N-methylol compounds (e.g., urea resins, melamine resins, and guanamine resins; phenolic resins, silane coupling agents, or other compounds), followed by drying to thereby further improve electrical characteristics of laminated sheets of the present invention.

For example, bases mainly comprising cellulose fibers have relatively high hygroscopicity often causing reduction in desired electrical characteristics due to moisture absorption and also reduction in adhesion to cured allyl ester resins, often resulting in inferior mechanical strength and heat resistance. Such disadvantages can be substantially alleviated by previously treating such cellulose fibers with at least one melamine resin.

Melamine resins which can be used for surface treatment of bases include methylol melamine resins, alkyl alcohol-modified methylol melamine resins, hydroxyethyl methacrylate-modified methylol melamine resins, allyl alcohol-modified melamine resins, and other suitable resins, in the form of solutions or suspensions. These melamine resins can be used either individually or as a combination of two or more thereof. Of such melamine resins, preferred are alkyl alcohol-modified methylol melamine resins and hydroxyethyl methacrylate-modified methylol melamine resins, because of their satisfactory preservation stability. Allyl alcohol-modified melamine resins are particularly preferred because of their effects of improving not only water resistance, but also impact resistance during punching and other processing treatments. The term "modified" as used herein means that a modified compound, e.g., an alkyl alcohol, hydroxyethyl methacrylate, etc., is also reacted in the reaction between melamine and formaldehyde in the production of melamine resins. Modified melamine resin containing unreacted modifying compound can be used as is without problems.

Examples of alkyl alcohols which can be used for preparing alkyl alcohol-modified methylol melamine resins include lower alcohols (e.g., methyl alcohol, propyl alcohol, and butyl alcohol) and, in addition, higher alcohols prepared from natural fats and oils (e.g., lauryl alcohol and oleyl alcohol, and synthetic higher alcohols).

Allyl alcohol-modified melamine resins can be obtained by etherifying a part or all of the methylol groups of an initial condensation product of a melamine derivative with formaldehyde, with allyl alcohol. The amount of formaldehyde to be reacted with a melamine derivative can be appropriately selected and usually ranges from about 2.0 to 3.5 mols per mol of a melamine derivative. A part of the allyl alcohol for modifying the methylol groups may be substituted with other lower alcohols comprising 5 or less carbon atoms.

The above-described melamine resin, such as allyl alcohol-modified melamine resin, is impregnated into a base comprising cellulose fiber in the form of a solution or a suspension in water, an alcohol, a ketone or other solvents, or a mixed solvent thereof.

Impregnation of cellulose fiber with melamine resins can generally be carried out by the use of dip coating, roll coating, spray coating, or other suitable coating, followed by drying in hot air. The amount of the melamine resin impregnated into cellulose fiber bases ranges from about 5 to 40 parts by weight, preferably from about 5 to 30 parts by weight, and more preferably from about 8 to 25 parts by weight, per 100 parts by weight of the fiber, though varying depending on the type of resins used. If the melamine resin content is less than about 5 parts by weight, the resulting laminated sheet tends to have reductional electrical characteristics after water absorption. If it exceeds 40 parts by weight, the impregnated base tends to dry too hard to be handled and to obtain sufficient mechanical strength or heat resistance.

In carrying out production of laminated sheets by using resin solutions according to the present invention, resin solutions comprising allyl ester resins, a solvent, a radical curing catalyst and, if desired, a crosslinking monomer are prepared and impregnated into a base by, for example, dipping. Then, the base impregnated with the resin solution (hereinafter referred to as a resin-impregnated base) is squeezed by means of rollers or other squeezing means, and dried by air-drying or heat drying by means of an oven or other drying means to obtain a prepreg. A plurality of the prepregs (usually about 2 to 20 prepregs) are laid on each other and heat-molded under pressure to cure the resin in order to obtain a laminated sheet (a prepreg method).

Heat molding under pressure can be carried out, for example, by a method in which a plurality of continuous prepregs optionally combined with a metal foil are continuously laminated and heated under pressure to cure the resin by means of a double belt pressing machine or other suitable pressing machine, or by a method in which a plurality of cut-to-size sheets of the prepreg optionally combined with metal foil are laminated and heated under pressure to cure the resin in a batch system by means of an ordinary pressing machine.

For production of metal-clad laminated sheets, metal foil is superposed on one or both sides of the plurality of the resin-impregnated bases and the laminate is heated under pressure to cure the resin. Metal foil can thus be adhered to a cure-molded laminated sheet.

In carrying out production of laminated sheets by using resin compositions according to the present invention, any of known techniques can be employed. Resin compositions are directly impregnated into a base, and a plurality of the resulting resin-impregnated bases are laminated (no prepreg state is involved) with or without metal foil on one or both sides of the laminate, and the laminate is heat-molded under pressure to cure the resin to obtain a laminated sheet. Metal foil with an adhesive may be adhered to a cure-molded laminated sheet.

In order to improve corrosion resistance, etching performance, and adhesion to resin-impregnated bases, metal foil which can be used in the metal-clad laminated sheet preferably includes an electrolytic copper foil, such as that commercially available for use in copper-clad laminated sheet for printed circuit boards. Such a metal foil preferably has a thickness of from about 10 to 100 μm.

Adhesives can optionally be used for adhesion of the metal foil. A metal foil with an adhesive applied thereon is preferred for effective achievement of adhesion to resin-impregnated bases. Adhesives which can be used preferably include fluid or semi-fluid adhesives which do not produce unnecessary by-products during a curing reaction. Examples of such adhesives are acrylate adhesives, epoxy adhesives, epoxy acrylate adhesives, isocyanate adhesives, and various modified adhesives obtained from these adhesives. Preferred of these are epoxy adhesives.

Epoxy adhesives which can be preferably used in the metal-clad laminated sheets are those containing at least one epoxy resin and polyvinyl butyral. Epoxy resins are compounds containing at least two oxirane rings per molecule and capable of forming a three-dimensional structure in the presence of a curing agent. While a number of conventional epoxy resins are employable, glycidyl type epoxy resins are preferred. Among glycidyl type epoxy resins more preferred is a mixture of bisphenol A diglycidyl ether and novolak polyglycidyl ether at a proper mixing ratio. For example, a preferred mixing ratio of bisphenol A diglycidyl ether to novolak polyglycidyl ether is in the range from about 40/60 to 90/10 by weight.

Many suitable curing agents including polyaddition curing agents, curing catalysts and latent curing agents, can be used for curing the above-described epoxy resins. Examples of suitable polyaddition curing agents include polyamines, such as straight chain aliphatic polyamines (e.g., diethylenetriamine, triethylenetetramine, tetraethylenepentamine, and diethylaminopropylamine); alicyclic polyamines (e.g., menthanediamine, isophoronediamine, N-aminoethylpiperazine, 3,9-bis(3-aminopropyl)-2,4,8,10-tetraoxyspiro[5,5]undecane adduct, bis(4-amino-3-methylcyclohexyl)methane, and bis(4-aminocyclohexyl)methane); aromatic polyamines (e.g., m-xylenediamine, diaminodiphenylmethane, m-phenylenediamine, and diaminodiphenylsulfone); various polyamides and modified polyamines; acid anhydrides (e.g., phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenonetetracarboxylic acid anhydride, ethylene glycol bis(anhydrotrimellitate), methylcyclohexenetetracarboxylic acid anhydride, trimellitic anhydride, and azelaic anhydride); phenol novolak; polymercaptan, and polysulfide.

Those included under the category of curing catalysts are catalysts for anionic polymerization, e.g., 2,4,6-tris(dimethylaminomethyl)phenol and various imidazole derivatives; and catalysts for cationic polymerization, e.g., a boron trifluoride monoethylamine complex. In addition, latent curing agents, such as dicyandiamine, can also be used. The above-enumerated specific examples are for illustrative purposes only but not for limitation, and the curing agent to be used is properly selected according to the end use.

Polyvinyl butyral to be used in the above described epoxy adhesives preferably contains about 75% by weight or more of a vinyl butyral group in the molecular chain thereof and has an average degree of polymerization of from about 500 to 5,000. If vinyl butyral group content is less than about 75% by weight or if the degree of polymerization is less than about 500, such epoxy adhesives have insufficient heat resistance. If the degree of polymerization exceeds about 5,000, solubility in solvents is undesirably reduced.

Polyvinyl butyral can be used in an amount of from about 10 to 300 parts by weight, and preferably from about 20 to 200 parts by weight, per 100 parts by weight of the epoxy resin. If the amount of polyvinyl butyral is less than about 10 parts by weight, the metal foil adhered has a low peel strength, and if it exceeds about 300 parts, heat resistance on soldering is deteriorated.

Heat resistance of the above-described epoxy adhesives can further be improved by using phenolic resins in combination therewith. Phenolic resins that can be used are reaction products of a phenol (e.g., phenol, cresol, and an alkylphenol), and formaldehyde. In the present invention, resol resins can also preferably used. Phenolic resins are usually used in an amount of from about 5 to 100 parts by weight per 100 parts by weight of the epoxy resin. With an amount less than about 5 parts, no improvement in heat resistance can be obtained. With an amount exceeding about 100 parts, the epoxy resin adhesive lacks flexibility and becomes brittle.

The above-described epoxy resin, curing agent, polyvinyl butyral and, if desired, phenolic resin are mixed and dissolved in an appropriate solvent to prepare an adhesive composition. In some cases depending on the type of the curing agent, for example, in the case of using dicyandiamide, the adhesive composition is used in a dispersed system. Hence, the kind of the solvent to be used is not particularly restricted, and can be selected appropriately according e.g., to the end use or the coating step adopted.

If desired, adhesive compositions may further contain fillers, reinforcements, colorants, curing accelerators, antioxidants, stabilizers, and othr additives.

Metal foil which can be used in the present invention typically includes copper foils commonly employed for copper-clad laminated sheets for printed circuit boards, such as an electrolytic copper foil and a rolled copper foil.

Application of the adhesive to metal foils, (e.g., copper foil), is conducted with an appropriate means selected from, e.g., a roll coater, a blade coater, a wire bar coater, or other approprint coater. It is preferable that metal foil with an adhesive applied thereon be used after being pre-heated to remove the solvent of the adhesive and, at the same time, to obtain a semi-cured state.

The thus produced laminated sheets usually have a thickness of from about 0.5 to 5 mm, though varying depending on the type of the base, the composition of the curable resin composition or resin solution, and the end use of the laminated sheet. The proportion of the resin composition in the laminated sheet usually ranges from about 30 to 80% by weight.

Resin solutions or resin compositions for laminated sheets according to the present invention and laminated sheets produced by using the same are now illustrated in greater detail by way of Examples and Comparative Examples, but it should be understood that the present invention is not deemed to be limited thereto. All the percents, parts, and ratios are given by weight unless otherwise indicated.

EXAMPLES 1 TO 6

Preparation of Allyl Ester Resins (A-1) to (A-5)

In a 1 l-volume three-necked flask equipped with a distillation means were charged 600 g of diallyl terephthalate, 78.4 g of ethylene glycol, and 0.1 g of dibutyltin oxide, and the mixture was heated at 180° C. in a nitrogen stream, while removing produced allyl alcohol by distillation. When about 140 g of allyl alcohol was distilled, the inner pressure was diminished to 50 mmHg, and the rate of distillation was accelerated. After a theoretical amount of allyl alcohol was removed, the reaction mixture was distilled by means of a film evaporator at 200° C. under reduced pressure of 1 mmHg to remove unreacted diallyl terephthalate. The residue was transferred to a tray, cooled, and ground to obtain a powdered allyl ester resin. The resulting allyl ester resin was designated (A-1).

In the same manner as for (A-1), except for using the reactants shown in Table 2 below, ally ester resins (A-2) to (A-5) were prepared.

TABLE 2

|  | A-1 | A-2 | A-3 | A-4 | A-5 |
|---|---|---|---|---|---|
| Dibasic Acid (g): |  |  |  |  |  |
| Diallyl terephthalate | 600 | 600 | 600 | — | — |
| Diallyl o-phthalate | — | — | — | 600 | — |
| Diallyl isophthalate | — | — | — | — | 600 |
| Dihydric Alcohol (g): |  |  |  |  |  |
| Ethylene glycol | 78.4 | — | — | — | — |
| 1,2-Propylene glycol | — | 92.7 | — | 92.7 | 92.7 |
| Diethylene glycol | — | — | 133.6 | — | — |
| Catalyst (dibutyltin oxide) (g) | 0.1 | 0.1 | 0.1 | 0.1 | 0.1 |

Preparation of Laminated Sheet

Kraft paper having a basis weight of 135 g/m² (available from Oji Paper Co., Ltd.) was soaked in an aqueous solution of Nica Resin S-305 (a trade name of methylol melamine available from Nippon Carbide Industries Co., Ltd.), squeezed through rollers, and dried at 120° C. for 30 minutes to obtain a paper base having a methylol melamine add-on of 11.4%.

The resulting paper base was dipped in a resin solution having the composition shown in Table 3 below, squeezed through rollers, dried in air for 30 minutes, and then dried in an oven at 120° C. for 5 minutes to prepare a prepreg. The resin add-on of the prepreg is shown in Table 3.

Eight prepregs were laid on each other and sandwiched between a pair of Lumilar films (polyester film available from Toray Industries, Inc.), and the laminate was hot-pressed at 160° C. and 10 kg/cm² for 20 minutes to obtain a laminated sheet having a thickness of from about 1.5 to 1.7 mm.

Electrical characteristics and heat resistance of each of the resulting laminated sheets were evaluated as follows. The results obtained are shown in Table 4.

Electric Characteristics

Dielectric constant and dielectric dissipation factor were measured in accordance with JIS (Japanese Industrial Standard) C6481 at 1 MHz. Tracking resistance was measured according an IEC (International Electrotechnical Commission) method.

Heat Resistance

The laminated sheet was dipped in a soldering bath at 260° C. for 5 minutes, and the appearance was observed with eyes and rated as follows.
Good ... No change in appearance was observed.
Bad ... Warpage and blister were observed.

COMPARATIVE EXAMPLE 1

Preparation of Unsaturated Polyester Resin (a-1)

In a 1 l-volume separable flask equipped with a stirrer, a thermometer, a tube for introducing a gas, and a condenser were charged 100 g of propylene glycol and 83.2 g of isophthalic acid, and the mixture was allowed to react at 185° C. for 3 hours while blowing nitrogen and removing condensed water by distillation. Then, 87.2 g of fumaric acid was added to the reaction mixture, followed by further reacting at 185° C. for 6 hours. The inner pressure was reduced to about 12 mmHg, and the inner temperature was raised up to 200° C. to complete the reaction. There was thus obtained a resin having an acid value of 30. The resulting resin was dissolved in styrene to prepare an unsaturated polyester resin having a styrene concentration of 47% (hereinafter designated (a-1)).

Preparation of Laminated Sheet

The same methylol melamine-treated paper base as used in Example 1 was floated on a resin composition comprising 100 parts of the above-prepared unsaturated polyester resin (a-1) and 2 parts of benzoyl peroxide to thereby impregnate the resin composition into the paper base from one side thereof.

Eight sheets of the resin-impregnated bases were laid on each other and hot-pressed in the same manner as in Example 1.

Electrical characteristics and heat resistance of the resulting laminated sheet as determined in the same manner as in Example 1 are shown in Table 4.

COMPARATIVE EXAMPLE 2

Electrical characteristics and heat resistance of a commercially available paper base phenol laminated sheet (thickness: 1.6 mm; XPC grade by ANSI (American National Standards Institute)) were determined in the same manner as in Example 1. The results are shown in Table 4.

TABLE 3

|  | Example 1 | Example 2 | Example 3 | Example 4 | Example 5 | Example 6 | Compara. Example 1 | Compara. Example 2 |
|---|---|---|---|---|---|---|---|---|
| Allyl Ester Resin (wt %) | A-1 | A-2 | A-3 | A-4 | A-5 | A-1 | Unsaturated polyester resin (a-1) | Phenolic resin laminated sheet |
|  | 100 | 100 | 100 | 100 | 100 | 90 |  |  |
| Diallyl Terephthalate (crosslinking monomer) (wt %) | — | — | — | — | — | 10 | — |  |
| Organic Peroxide (part)* |  |  |  |  |  |  |  |  |
| Benzoyl peroxide | 0.5 | 0.5 | 0.5 | 0.5 | 0.5 | 0.5 | 2.0 | — |
| Dicumyl peroxide | 1.5 | 1.5 | 1.5 | 1.5 | 1.5 | 1.5 | — |  |
| Solvent (part)* |  |  |  |  |  |  |  |  |

TABLE 3-continued

|  | Example 1 | Example 2 | Example 3 | Example 4 | Example 5 | Example 6 | Compara. Example 1 | Compara. Example 2 |
|---|---|---|---|---|---|---|---|---|
| Acetone | 30 | 30 | — | — | 30 | 30 | — | |
| Methyl ethyl ketone | — | — | 30 | 30 | — | — | — | |
| Resin Content of Resin-Impregnated Base (wt %) | 42 | 45 | 41 | 32 | 38 | 43 | — | |

Note
*Per 100 parts of the resinous content.

TABLE 4

|  | Example 1 | Example 2 | Example 3 | Example 4 | Example 5 | Example 6 | Compara. Example 1 | Compara. Example 2 |
|---|---|---|---|---|---|---|---|---|
| Electrical Characteristics: | | | | | | | | |
| Dielectric constant | 3.2 | 3.1 | 3.3 | 3.6 | 3.6 | 3.1 | 3.8 | 4.2 |
| Dielectric dissipation Factor ($\times 10^{-2}$) | 2.3 | 2.1 | 2.4 | 2.5 | 2.5 | 2.3 | 2.8 | 3.5 |
| Tracking resistance (V) | >600 | >600 | >600 | >600 | >600 | >600 | >600 | 300 |
| Heat Resistance | Good | Good | Good | Good | Good | Good | Bad | Good |

As can be seen from Table 4, the laminated sheets according to the present invention have higher heat resistance than the comparative laminated sheet obtained by using the unsaturated polyester resin (a-1) and exhibit superior electrical characteristics than commercially available phenol resin laminated sheets.

As described and demonstrated above, according to the process of the present invention, in which a resin solution of at least one allyl ester resin comprising a polybasic acid and a polyhydric alcohol, wherein an allyl ester group of said resin is bonded to at least one of the terminals thereof, is impregnated into a base and, after drying, a plurality of the resulting prepregs are heated under pressure, a laminated sheet can be produced in a relatively short period of time for cure-molding. The thus produced laminated sheet provides suitable and superior heat resistance and electrical characteristics, as compared to unsaturated polyester resin laminated sheets.

EXAMPLES 7 TO 19 AND COMPARATIVE EXAMPLE 3 TO 4

Synthesis of Allyl Ester Resins (A-6) to (A-14)

Allyl ester resins (A-6) to (A-14) were prepared in the same manner as in Example 1, except for using the materials shown in Table 5 below.

having the composition shown in Table 6 below to impregnate the resin composition into the paper base from one side thereof.

Eight resin-impregnated paper bases were laid on each other, with an electrolytic copper foil "MK-61" (thickness 35 μm) (available from Mitsui Mining and Smelting Co., Ltd.) on one side of which an adhesive had been applied as an utmost layer, and the laminate was sandwiched between a pair of Lumilar films and hot-pressed by means of a pressing machine at 140° C. for 10 minutes under a pressure of 10 kg/cm². The laminate was further heated at 150° C. for 1 hour in a drier to complete curing. The resulting copper-clad laminated sheet had a thickness of from about 1.5 to 1.7 mm.

Electric characteristics of each of the laminated sheets were determined in the same manner as in Example 1, except that the measurements were conducted after etching of the copper foil. Further, heat resistance and punchability of the laminated sheet were evaluated as follows. The results obtained are shown in Table 7.

Heat Resistance

After etching the copper foil, the laminated sheet was dipped in a soldering bath at 260° C. for 1 minutes, and the appearance was observed with eyes.

TABLE 5

|  | A-6 | A-7 | A-8 | A-9 | A-10 | A-11 | A-12 | A-13 | A-14 |
|---|---|---|---|---|---|---|---|---|---|
| Dibasic Acid (g): | | | | | | | | | |
| Diallyl phthalate | 600 | 600 | 600 | 600 | 600 | 541 | 600 | — | — |
| Diallyl o-phthalate | — | — | — | — | — | — | — | 600 | — |
| Diallyl isophthalate | — | — | — | — | — | — | — | — | 600 |
| Tribasic Acid (Triallyl trimellitate) (g) | — | — | — | — | — | 80.0 | — | — | — |
| Dihydric Alcohol (g): | | | | | | | | | |
| Ethylene glycol | 78.4 | — | — | — | — | — | — | — | — |
| 1,4-Butanediol | — | 109.8 | — | — | — | — | — | — | — |
| 1,2-Propylene glycol | — | — | 92.7 | — | — | 92.7 | 92.7 | 92.7 | 92.7 |
| Diethylene glycol | — | — | — | 133.6 | — | — | — | — | — |
| Triethylene glycol | — | — | — | — | 189.0 | — | — | — | — |
| Tetrahydric Alcohol (Pentaerythritol) (g) | — | — | — | — | — | — | 40.0 | — | — |
| Catalyst (Dibutyl-tin oxide) (g) | 0.1 | 0.1 | 0.1 | 0.1 | 0.1 | 0.1 | 0.1 | 0.5 | 0.5 |

Preparation of Laminated Sheet

The same methylol melamine-treated paper base as used in Example 1 was floated on a resin composition

Punchability

The temperature at which 10 holes of 0.8 mm in diameter at a pitch of 1.78 mm could be punched out without causing cracks.

COMPARATIVE EXAMPLE 5

A copper-clad laminated sheet was prepared in the same manner as in Example 7, except for using a resin composition comprising 100 parts of the unsaturated polyester resin (a-1) as used in Comparative Example 1 and 2 parts of benzoyl peroxide. The results of characteristics determination are shown in Table 7.

COMPARATIVE EXAMPLE 6

Various characteristics of a commercially available paper base phenolic resin laminated sheet (thickness: 1.6 mm; XPC grade) were determined in the same manner as in Example 7. The results are shown in Table 7.

tics than the commercially available phenol resin laminated sheet. Performance properties of the laminated sheet of Comparative Example 3 were unmeasurable because the resin composition had a high viscosity and could not be uniformly impregnated into the base. The laminated sheet of Comparative Example 4 was poor in heat resistance.

EXAMPLES 20 TO 27 AND COMPARATIVE EXAMPLES 7 TO 8

Copper-clad laminated sheets were produced in the same manner as in Example 7, except for changing the composition of the resin composition as shown in Table 8 below.

Physical properties of each of the resulting laminated sheets were measured according to JIS C-6481, and the results obtained are shown in Table 9.

COMPARATIVE EXAMPLE 9

A copper-clad laminated sheet was produced in the

TABLE 6

| | Example No. | | | | | | | | | | | | | Comparative Example | | | |
|---|---|---|---|---|---|---|---|---|---|---|---|---|---|---|---|---|---|
| | 7 | 8 | 9 | 10 | 11 | 12 | 13 | 14 | 15 | 16 | 17 | 18 | 19 | 3 | 4 | 5 | 6 |
| Allyl Ester Resin (wt %) | A-6 | A-7 | A-8 | A-8 | A-9 | A-10 | A-11 | A-12 | A-13 | A-14 | A-7 | A-8 | A-8 | A-6 | A-6 | a-1* | phenolic resin |
| | 80 | 80 | 40 | 60 | 60 | 60 | 60 | 60 | 60 | 60 | 40 A-8 40 | 20 A-9 50 | 20 A-10 50 | 96 | 35 | 100 | |
| Crosslinking Monomer (wt %): | | | | | | | | | | | | | | | | | |
| Diallyl terephthalate | — | — | 20 | 20 | 10 | 20 | 20 | 20 | 20 | 20 | 10 | 10 | 10 | 4 | — | — | |
| n-Butyl acrylate | 20 | 20 | 20 | 10 | 10 | 10 | 10 | 10 | 10 | 10 | — | — | — | — | 45 | — | |
| Methyl methacrylate | — | — | 20 | 10 | 20 | 10 | 10 | 10 | 10 | 10 | 10 | 20 | 20 | — | 20 | — | |
| Organic Peroxide (part)** | | | | | | | | | | | | | | | | | |
| Benzyl peroxide | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | 2.0 | |
| Dicumyl peroxide | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 | — | |

Note
*Unsaturated polyester resin
**Per 100 parts of the resin content

TABLE 7

| | Example No. | | | | | | | | | | | | |
|---|---|---|---|---|---|---|---|---|---|---|---|---|---|
| | 7 | 8 | 9 | 10 | 11 | 12 | 13 | 14 | 15 | 16 | 17 | 18 | 19 |
| Dielectric Constant | 3.3 | 3.2 | 3.3 | 3.3 | 3.5 | 3.5 | 3.2 | 3.2 | 3.7 | 3.7 | 3.4 | 3.4 | 3.4 |
| Dielectric Dissipation Factor ($\times 10^{-2}$) | 2.4 | 2.5 | 2.5 | 2.3 | 2.5 | 2.5 | 2.4 | 2.3 | 2.7 | 2.7 | 2.6 | 2.6 | 2.7 |
| Tracking Resistance (V) | >600 | >600 | >600 | >600 | >600 | >600 | >600 | >600 | >600 | >600 | >600 | >600 | >600 |
| Heat Resistance | No abnormality was observed | | | | | | | | | | | | |
| Punchability (°C.) | 50 | 30 | 50 | 50 | 30 | 30 | 60 | 60 | 50 | 50 | 40 | 40 | 40 |

| | Comparative Example | | | |
|---|---|---|---|---|
| | 3 | 4 | 5 | 6 |
| Dielectric Constant | Non-uniform impregnation into base | 3.3 | 3.8 | 4.2 |
| Dielectric Dissipation Factor ($\times 10^{-2}$) | | 2.5 | 2.8 | 3.5 |
| Tracking Resistance (V) | | >600 | >600 | 300 |
| Heat Resistance | | Blister | Blister | No Abnormality |
| Punchability (°C.) | | 40 | 40 | 60 |

As is apparent from the results of Table 7, the laminated sheets according to the present invention have higher heat resistance than the comparative laminated sheet obtained by using the unsaturated polyester resin (a-1) and exhibit more excellent electrical characteristics than the commercially available phenol resin laminated sheet.

same manner as in Example 7, except for using a resin composition comprising 100 parts of the unsaturated polyester resin (a-1) and 2 parts of benzoyl peroxide. Various characteristics of the resulting laminated sheet are shown in Table 9.

TABLE 8

| | Example No. | | | | | | | | Compara. Example 7 | Compara. Example 8 | Compara. Example 9 |
|---|---|---|---|---|---|---|---|---|---|---|---|
| | 20 | 21 | 22 | 23 | 24 | 25 | 26 | 27 | | | |
| Allyl Ester Resin | A-6 | A-6 | A-6 | A-8 | A-9 | A-13 | A-14 | A-6 | A-6 | A-6 | a-1 |
| (wt %) | 95 | 40 | 70 | 70 | 70 | 70 | 70 | 70 | 96 | 35 | 100 |
| Crosslinking Monomer (wt %): | | | | | | | | | | | |
| Diallyl terephthalate | — | 20 | 10 | 10 | 10 | 10 | 10 | 10 | 2 | 10 | — |
| n-Butyl acrylate | 4 | 20 | 10 | 10 | 10 | 10 | 10 | 20 | — | 45 | — |
| Polyfunctional Crosslinking Monomer (wt %): | | | | | | | | | | | |
| Allyl acrylate | — | — | 10 | — | — | — | — | — | — | — | — |
| Allyl methacrylate | 1 | 20 | — | 10 | 10 | 10 | 10 | — | 2 | 10 | — |
| Organic Peroxide (part)* | | | | | | | | | | | |
| Benzoyl peroxide | 1.0 | 1.0 | 1.0 | 1.0 | 1.0 | 1.0 | 1.0 | 1.0 | 1.0 | 1.0 | 2.0 |
| Dicumyl peroxide | 1.0 | 1.0 | 1.0 | 1.0 | 1.0 | 1.0 | 1.0 | 1.0 | 1.0 | 1.0 | 1.0 |

Note
*Per 100 parts of the resin content

TABLE 9

| | Example No. | | | | | | | | Compara. Example 7 | Compara. Example 8 | Compara. Example 9 |
|---|---|---|---|---|---|---|---|---|---|---|---|
| | 20 | 21 | 22 | 23 | 24 | 25 | 26 | 27 | | | |
| Mechanical Properties at Room Temperature: | | | | | | | | | | | |
| Flexural Strength (kgf/mm$^2$) | 18.5 | 17.4 | 15.3 | 17.2 | 15.3 | 16.4 | 15.1 | 13.4 | non-uniform impregnation into the base | 12.8 | 11.4 |
| Flexural Modulus (kgf/mm$^2$) | 1100 | 900 | 680 | 920 | 650 | 680 | 630 | 480 | | 420 | 410 |
| Hot Mechanical Properties (100° C.): | | | | | | | | | | | |
| Flexural Modulus | 720 | 680 | 630 | 580 | 450 | 410 | 410 | 350 | | 180 | 310 |

As is apparent from the results of Examples 20 to 26 in view of Example 27 and Comparative Examples 7 to 9, the laminated sheets according to the present invention in which a polyfunctional crosslinking monomer is used in combination with a monofunctional crosslinking monomer exhibits further improved mechanical properties both at room temperature and at a high temperature.

As described and demonstrated above, laminated sheets can be produced without employing a prepreg method by using a resin composition comprising from about 40 to 95% of the allyl ester resin and from about 5 to 60% of a radical polymerizable crosslinking monomer as an impregnating resin. By this process, cost incurred for raw materials and equipment can be reduced, and the processing step can be simplified. Additionally, laminated sheets produced by using the above-described resin composition provides both superior heat resistance and electrical characteristics as well.

Furthermore, laminated sheets produced by using allyl ester resin compositions in which a polyfunctional crosslinking monomer is used as a part or the whole of the crosslinking monomer has improved strength at room and high temperatures.

EXAMPLES 28 TO 30

Preparation of Allyl Ester Resins (A-15)

An allyl ester resin (A-15) was prepared in the same manner as for (A-1) of Example 1, except for replacing 78.4 g of ethylene glycol with 95.9 g (1.26 mol) of propylene glycol. The materials used are shown in Table 10 below.

Preparation of Bromine-Containing Allyl Ester Resin (A-16)

In the same manner as for (A-15), except for replacing 95.9 g of propylene glycol with 330 g (1.26 mol) of dibromoneopentyl glycol (hereinafter abbreviated as DBNPG), a bromine-containing ally ester resin (A-16) was prepared.

TABLE 10

| | A-15 | A-16 |
|---|---|---|
| Saturated Polybasic Acid | diallyl terephthalate 600 g (2.44 mol) | diallyl terephthalate 600 g (2.44 mol) |
| Saturated Polyhydric Alcohol | propylene glycol 95.9 g (1.26 mol) | DBNPG 330 g (1.26 mol) |
| Catalyst | dibutyltin oxide 0.1 g | dibutyltin oxide 0.1 g |
| Halogen Content in Resin Product | 0 | Br: 25.7% |

Preparation of Laminated Sheet

Kraft paper having a basis weight of 155 g/m² and a thickness of 300 μm was soaked in a solution of a methylol melamine resin "Nica Resin S-305"(a tradename of methylol melamine available from Nippon Carbide Industries, Co., Ltd.), squeezed through rollers, and dried at 120° C for 30 minutes to obtain a paper base having a melamine resin add-on of 15%.

The resulting melamine resin-treated paper base was floated on a resin solution having the composition shown in Table 11 below to thereby impregnate the resin composition into the base from one side thereof.

Seven resin-impregnated bases were laid on each other, with a copper foil "MK-61" on one side of which an adhesive had been applied as an utmost layer, and the laminate was sandwiched between a pair of 50 μm-thick polyester films and hot-pressed by means of a pressing machine at 150° C. for 5 minutes under a pressure of 30 kg/cm². The laminate was further heated at 150° C. for 2 hours in a hot-air drier to obtain a copper-clad laminated sheet having a thickness of 1.6 mm.

Each of the laminated sheets were evaluated in terms of appearance, flexural modulus (JIS C-6481), and punchability, and the results obtained are shown in Table 12.

COMPARATIVE EXAMPLES 10 TO 12

A copper-clad laminated sheet was produced in the same manner as in Examples 28 to 30, except for changing the composition of the resin composition as shown in Table 11.

The resulting laminated sheet was evaluated in the same manner as in Examples 28 to 30, and the results obtained are shown in Table 12.

prising allyl ester resins of the present invention, can achieve curing in a reduced time by preliminarily incorporating from about 1 to 30% by weight of a polyfunctional (meth)acrylate compound into such resin compositions. Hence, according to a preferred embodiment of the present invention, the time required for hot pressing can thereby be reduced and productivity can be increased. Furthermore, resulting laminated sheets have superior appearance, mechanical strength, and punchability, while sufficiently satisfying other characteristics required for use in electrical parts.

EXAMPLES 31 TO 38 AND COMPARATIVE EXAMPLES 13 TO 15

Preparation of Allyl Ester Resins (A-17) to (A-21)

Allyl ester resins (A-17) to (A-21) were prepared in the same manner as in Example 1, except for using the materials shown in Table 14 below.

TABLE 14

|  | A-17 | A-18 | A-19 | A-20 | A-21 |
|---|---|---|---|---|---|
| Dibasic acid (g): |  |  |  |  |  |
| Diallyl terephthalate | 600 | 600 | 600 | 600 | — |
| Diallyl isophthalate | — | — | — | — | 600 |
| Dihydric alcohol (g): |  |  |  |  |  |
| Ethylene glycol | 78.4 | — | — | — | 78.4 |
| 1,4-Butanediol | — | 109.8 | — | — | — |
| 1,6-Hexanediol | — | — | 149.3 | — | — |
| Diethylene glycol | — | — | — | 133.6 | — |
| Catalyst (dibutyltin oxide) (g) | 0.1 | 0.1 | 0.1 | 0.1 | 0.1 |

Preparation of Laminated Sheet

The same methylol melamine-treated paper base as used in Example 1 was dipped in a resin composition

TABLE 11

|  | Example 28 | Example 29 | Example 30 | Compara. Example 10 | Compara. Example 11 | Compara. Example 12 |
|---|---|---|---|---|---|---|
| Composition (wt %): |  |  |  |  |  |  |
| Allyl ester resin (A-15) | 15 | 15 | — | 15 | 15 | — |
| Bromine-containing allyl ester resin (A-16) (Br: 25.7%) | 50 | 50 | 50 | 50 | 50 | 50 |
| 2-Ethylhexyl acrylate | 18 | 18 | 13 | 18 | 18 | 8 |
| Methyl methacrylate | 9 | 5 | — | 10 | 9.5 | — |
| Diallyl terephthalate | 5 | 5 | 5 | 5 | 5 | 5 |
| Trimethylolpropane triacrylate | 1 | 5 | 30 | — | 0.5 | 35 |
| Bis(4-t-butylcyclohexyl)peroxy dicarbonate | 0.5 | 0.5 | 0.5 | 0.5 | 0.5 | 0.5 |
| Benzoyl peroxide | 0.5 | 0.5 | 0.5 | 0.5 | 0.5 | 0.5 |
| Dicumyl peroxide | 1 | 1 | 1 | 1 | 1 | 1 |
| Weight of resin composition per 100 parts of paper | 85 | 85 | 85 | 85 | 85 | 85 |

TABLE 12

|  | Example 28 | Example 29 | Example 30 | Compara. Example 10 | Compara. Example 11 | Compara. Example 12 |
|---|---|---|---|---|---|---|
| Appearance | Good | Good | Good | Whitening | Whitening | Whitening |
| Flexural Strength (kg/mm²) | 15.6 | 16.0 | 16.5 | 14.0 | 14.2 | 16.5 |
| Punchability: |  |  |  |  |  |  |
| Working Punching Temp. (°C.) | 40–70 | 40–70 | 40–70 | 40–70 | 40–70 | — |
| Appearance | Good | Good | Good | Good | Good | Cracking was observed |

As can be seen from Tables 11 and 12, in the production of laminated sheets by heat-curing, a plurality of bases impregnated with resin compositions mainly comprising each of the above-prepared allyl ester resins (A-17) to (A-21) and the crosslinking monomer shown in Table 15 below, and 1 part each of benzoyl peroxide and dicumyl peroxide per 100 parts of the total amount of the allyl ester resin and the crosslinking monomer(s). The Tg of the cured product of the resin composition as measured with a thermal mechanical analyser is also shown in Table 15.

Eight sheets of the resulting resin-impregnated base were laid on each other with a copper foil "MK-61" on one side of which an adhesive had been applied as an utmost layer, and sandwiched between a pair of Lumilar films. The laminate was hot-pressed at 140° C. and 10 kg/cm² for 10 minutes and further heated in a drier at 150° C for 1 hour to complete curing. The resulting laminated sheet had a thickness of from about 1.5 to 1.7 mm.

Electrical characteristics, mechanical properties, heat resistance, and punchability of each of the resulting laminated sheets were measured in the same manner as in Examples 7 to 19. The results obtained are shown in Table 16.

COMPARATIVE EXAMPLE 16

A copper-clad laminated sheet was produced in the same manner as in Example 31, except for replacing the allyl ester resin and the crosslinking monomer(s) with an unsaturated polyester resin (a-2) containing 35% of styrene which was synthesized from phthalic anhydride, maleic anhydride, and diethylene glycol at a molar ratio of 1:1:2. The Tg of the cured product of the polyester resin (a-2) is shown in Table 15, and various characteristics of the resulting laminated sheet as determined in the same manner as in Example 31 are shown in Table 16.

TABLE 15

|  | Example No. |  |  |  |  |  |  |  | Compara. Example 13 | Compara. Example 14 | Compara. Example 15 | Compara. Example 16 |
|---|---|---|---|---|---|---|---|---|---|---|---|---|
|  | 31 | 32 | 33 | 34 | 35 | 36 | 37 | 38 |  |  |  |  |
| Allyl Ester Resin (wt %) | A-18 80 | A-19 80 | A-20 80 | A-21 65 | A-17 65 | A-17 60 | A-19 70 | A-19 60 | A-17 80 | A-18 96 | A-18 35 | a-2 100 |
| Crosslinking Monomer (wt %): |  |  |  |  |  |  |  |  |  |  |  |  |
| Diallyl terephthalate | 20 | 20 | 20 | 15 | 15 | 10 | 10 | 10 | 20 | 4 | — | — |
| n-Butyl acrylate | — | — | — | 20 | 20 | 20 | 20 | 20 | — | — | 45 | — |
| Methyl methacrylate | — | — | — | — | — | 10 | — | 10 | — | — | 20 | — |
| Organic Peroxide (part)* |  |  |  |  |  |  |  |  |  |  |  |  |
| Benzoyl peroxide | 1.0 | 1.0 | 1.0 | 1.0 | 1.0 | 1.0 | 1.0 | 1.0 | 1.0 | 1.0 | 1.0 | 1.0 |
| Dicumyl peroxide | 1.0 | 1.0 | 1.0 | 1.0 | 1.0 | 1.0 | 1.0 | 1.0 | 1.0 | 1.0 | 1.0 | 1.0 |
| Tg of Hardened Product (°C.) | 60 | 50 | 80 | 45 | 50 | 40 | 30 | 25 | 120 | 95 | 15 | 40 |

Note *Per 100 parts of the resin content

TABLE 16

|  | Example No. |  |  |  |  |  |  |  | Compara. Example 13 | Compara. Example 14 | Compara. Example 15 | Compara. Example 16 |
|---|---|---|---|---|---|---|---|---|---|---|---|---|
|  | 31 | 32 | 33 | 34 | 35 | 36 | 37 | 38 |  |  |  |  |
| Dielectric Constant | 3.3 | 3.2 | 3.3 | 3.5 | 3.4 | 3.3 | 3.2 | 3.2 | 3.3 | Non-uniform impregnation into base | — | 3.8 |
| Dielectric Dissipation Factor ($\times 10^{-2}$) | 2.4 | 2.5 | 2.6 | 2.6 | 2.5 | 2.4 | 2.3 | 2.5 | 2.4 |  | — | 2.8 |
| Tracking Resistance (V) | >600 | >600 | >600 | >600 | >600 | >600 | >600 | >600 | >600 |  | >600 | >600 |
| Hot Flexural Modulus (kg/mm², 100° C.) | 650 | 600 | 600 | 600 | 600 | 550 | 550 | 600 | 700 |  | 450 | 450 |
| Heat Resistance | No abnormality was observed |  |  |  |  |  |  |  |  |  | Blister | Blister |
| Punchability (°C.) | 40 | 40 | 50 | 40 | 40 | 30 | 30 | 30 | 90 |  | Bulging | 40 |

As is apparent from Table 16, laminated sheets according to the present invention have superior punchability at alow room temperature and also superior heat resistance as compared to laminated sheets produced by using conventional unsaturated polyester resins. Furthermore, the cured product of the resin composition used in Comparative Example 13 has a Tg higher than about 90° C., so that the laminated sheet obtained from such a resin composition requires a high temperature for adequate punching. Therefore, when such a sheet was punched at about room temperature the cut-out area usually cracks. Additionally, the cured product of the resin composition of Comparative Example 15 has a Tg lower than about 20° C. Therefore, such a laminated sheet was punched at about room temperature the cut-out area suffered from bulging. The laminated sheet was also inferior in heat resistance. Also, the resin composition of Comparative Example 14 was non-uniformly impregnated into the base due to its high viscosity, and performance properties of the resulting laminated sheet were unmeasurable and unsuitable.

As demonstrated above, resin compositions according to a preferred embodiment of the present invention, which comprises from about 40 to 95% by weight of the allyl ester resin and from about 5 to 60% by weight of a radical polymerizable crosslinking monomer, and cured products of resin compositions having a Tg of from about 20° to 90° C., can be used for producing laminated sheets without using a prepreg method. According to such an embodiment, the cost incurred for raw materials and equipment can be reduced, and the processing step can be simplified. Moreover, laminated sheets obtained from the above-described resin compositions exhibit improved punchability at about room temperature while retaining other superior properties, such as heat resistance, mechanical characteristics, and electrical characteristics.

EXAMPLES 39 TO 42 AND COMPARATIVE EXAMPLES 17 TO 19

Preparation of Allyl Ester Resin (A-22)

Allyl ester resin (A-15) and bromine-containing allyl ester resin (A-16) as synthesized in Examples 28 to 30 were used.

A chlorine-containing allyl ester resin (A-22) was synthesized in the same manner as for (A-15) and (A-16), except for using the materials shown in Table 17 shown below.

TABLE 17

|  | A-15 | A-16 | A-22 |
|---|---|---|---|
| Saturated Polybasic Acid | diallyl terephthalate 600 g (2.44 mol) | diallyl terephthalate 600 g (2.44 mol) | diallyl chlorendate 600 g (1.28 mol) |
| Saturated Polyhydric Alcohol | propylene glycol 95.9 g (1.26 mol) | DBNPG* 330 g (1.26 mol) | propylene glycol 50.2 g (0.66 mol) |
| Catalyst | dibutyltin oxide | dibutyltin oxide | dibutyltin oxide |

TABLE 17-continued

|  | A-15 | A-16 | A-22 |
|---|---|---|---|
| Halogen Content in Resin Product | 0.1 g 0 | 0.1 g Br: 25.7% | 0.1 g Cl: 47.5% |

*DBNPG: Dibromoneopentyl glycol

Preparation of Laminated Sheet

The same melamine resin-treated paper base as used in Examples 28 to 30 was impregnated with each of the resin compositions shown in Table 18 shown below in the same manner as in Examples 28 to 30.

Seven resin-impregnated bases were laid on each other, with a copper foil "MK-61" on one side of which an adhesive had been applied as an utmost layer, and the laminate was sandwiched between a pair of 50 μm-thick polyester films and hot-pressed by means of a pressing machine at 140° C. for 30 minutes under a pressure of 30 kg/cm². The laminate was further heated at 150° C. for 2 hours in a hot-air drier to obtain a copper-clad laminated sheet having a thickness of 1.6 mm.

Each of the laminated sheets were evaluated in terms of flammability (UL-94), mechanical characteristics (JIS C-6481), electric characteristics (UL-746A), and heat resistance (JIS C-6481; a sample from which the copper foil had been removed was tested), and the results obtained are shown in Table 19 below.

COMPARATIVE EXAMPLE 20

Various physical properties of a commercially available copper-clad paper base phenol laminated sheet (thickness: 1.6 mm; XPC grade) were measured in the same manner as in Examples 39 to 42. The results obtained are shown in Table 19.

TABLE 18

|  | Example 39 | Example 40 | Example 41 | Example 42 | Compara. Example 17 | Compara. Example 18 | Compara. Example 19 |
|---|---|---|---|---|---|---|---|
| Resin Composition (wt %): | | | | | | | |
| Allyl ester resin (A-15) | 15 | 0 | 15 | 52 | 0 | 0 | 60 |
| Bromine-containing allyl ester resin (A-16) | 50 | 50 | 0 | 13 | 0 | 0 | 5 |
| Chlorine-containing allyl ester resin (A-22) | 0 | 0 | 60 | 0 | 0 | 0 | 0 |
| Unsaturated polyester resin* | 0 | 20 | 0 | 0 | 50 | 20 | 0 |
| Bromine-containing unsaturated polyester resin** | 0 | 0 | 0 | 0 | 13 | 50 | 0 |
| Brominated diphenyl ether*** | 0 | 0 | 0 | 0 | 30 | 0 | 0 |
| 2-Ethylhexyl acrylate | 13 | 13 | 13 | 13 | 0 | 13 | 13 |
| Methyl methacrylate | 10 | 10 | 10 | 10 | 0 | 10 | 10 |
| Diallyl terephthalate | 5 | 0 | 5 | 5 | 0 | 0 | 5 |
| Benzoyl peroxide | 1 | 1 | 1 | 1 | 1 | 1 | 1 |
| Dicumyl peroxide | 1 | 1 | 1 | 1 | 1 | 1 | 1 |
| Antimony trioxide | 5 | 5 | 5 | 5 | 5 | 5 | 5 |
| Amount (part) of resin composition per 100 parts of paper | 85 | 85 | 85 | 85 | 85 | 85 | 85 |
| Halogen content in resin composition (%) | Aliphatic Br: 12.9 | Aliphatic Br: 12.9 | Alicyclic Cl: 28.5 | Aliphatic Br: 3.3 | Alicyclic Br: 3.0 Aromatic Br: 19.2 | Alicyclic Br: 11.5 | Aliphatic Br: 1.3 |
| Weight ratio of radical curable resin to halogen-containing | 23/77 | 29/71 | 20/80 | 80/20 | — | — | 92/8 |

TABLE 18-continued

|  | Example 39 | Example 40 | Example 41 | Example 42 | Compara. Example 17 | Compara. Example 18 | Compara. Example 19 |
|---|---|---|---|---|---|---|---|
| allyl ester resin |  |  |  |  |  |  |  |

Note
*"Polymal 6305" available from Takeda Seiyaku Co., Ltd
**"FMS 583" available from Nippon Yupica K.K., bromine content 23%
***Bromine content 64%

TABLE 19

|  | Example 39 | Example 40 | Example 41 | Example 42 | Compara. Example 17 | Compara. Example 18 | Compara. Example 19 | Compara. Example 20 |
|---|---|---|---|---|---|---|---|---|
| Flammability | V-0 | V-0 | V-0 | V-1 | V-0 | V-0 | Combustion | V-0 |
| Flexural Strength (kg/mm²) | 15.5 | 15.3 | 15.1 | 15.2 | 13.1 | 14.8 | 15.2 | 15.1 |
| Flexural Strength Retention* (%) | 80 | 78 | 75 | 80 | 69 | 65 | 82 | 80 |
| Breakdown Strength Retention* (%) | 110 | 100 | 98 | 100 | 85 | 80 | 105 | 87 |
| Tracking Resistance (CTI) (V) | >600 | >600 | 600 | >600 | 500 | 500 | >600 | 300 |
| Heat Resistance (200° C., 120 mins) | No abnormality was observed | | | | Serious color change | Serious color change | No abnormality was observed | Serious color change |

Note: *Heating condition 170° C. · 300 hours

As can be seen from Table 19, the laminated sheet obtained from the resin composition containing a halogen-containing allyl ester resin exhibits higher heat resistance as compared with the unsaturated polyester resin laminated sheets of Comparative Examples 17 and 18 and more excellent electrical characteristics as compared with the phenolic resin laminated sheet of Comparative Example 19.

As demonstrated above, resin composition according to a preferred embodiment of the present invention can provide laminated sheets for electrical parts, such as copper-clad laminated sheets, which have superior heat resistance and flame retardancy while sufficiently satisfying other characteristic requirements.

EXAMPLES 43 TO 45

Kraft paper having a basis weight of 155 g/m² and a thickness of 300 μm was soaked in a methylol melamine resin solution having the formulation as shown in Table 20 below, squeezed through rollers, and dried at 120° C. for 30 minutes to obtain a melamine resin-treated paper base. The resin add-on of the resulting paper base is also shown in Table 20.

TABLE 20

|  | Melamine Resin Composition | | |
|---|---|---|---|
|  | Example 43 | Example 44 | Example 45 |
| Composition (wt %): |  |  |  |
| Methylol melamine resin* | 12 | — | 8 |
| Methylated methylol melamine resin** | — | 30 | — |
| 2-Hydroxyethyl methacrylate | — | — | 12 |
| Methanol | 35.2 | 28 | 32 |
| Water | 52.8 | 42 | 48 |
| Resin Add-on*** | 15.3 | 15.8 | 15.2 |

Note:
*Nica Resin S-305 available from Nippon Carbide Industries, Co., Ltd.
**Mirbone Resin MR-2 available from Showa Highpolymer Co., Ltd.
***Per 100 parts of the kraft paper Each of the resulting melamine resin-treated paper bases was floated on a resin composition comprising 78 parts of the allyl ester resin (A-15) as prepared in Examples 28 to 30, 20 parts of n-butyl acrylate, 1 part of benzoyl peroxide, and 1 part of dicumyl peroxide to impregnate the resin composition into the base from one side thereof.

Seven resin-impregnated bases were laid on each other, with a copper foil MK-61 on one side of which an adhesive had been applied as an utmost layer, and the laminate was sandwiched between a pair of 50 μm-thick polyester films and hot-pressed by means of a pressing machine at 140° C. for 30 minutes under a pressure of 30 kg/cm². The laminate was further heated at 150° C. for 2 hours in a hot-air drier to obtain a copper-clad laminated sheet having a thickness of from about 1.4 to 1.8 mm.

The laminated sheet was evaluated in terms of water absorption, heat resistance, flexural strength (JIS C-6481), and electrical characteristics, and the results obtained are shown in Table 21 below.

EXAMPLE 46

A copper-clad laminated sheet was prepared in the same manner as in Example 43, except for replacing 78 parts of the allyl ester resin (A-15) with 73 parts of the bromine-containing allyl ester resin (A-16) as prepared in Examples 28 to 30 and 5 parts of antimony trioxide. The resulting laminated sheet had a thickness of 1.6 mm. Results of evaluations are shown in Table 21.

COMPARATIVE EXAMPLE 21

A copper-clad laminated sheet was prepared in the same manner as in Example 43, except for using the kraft paper which was not treated with the melamine resin as a base. Results of evaluations are shown in Table 21.

COMPARATIVE EXAMPLE 22

A copper-clad laminated sheet was prepared in the same manner as in Example 46, except for using the kraft paper which was not treated with the melamine resin as a base. Results of evaluations are shown in Table 21.

COMPARATIVE EXAMPLE 23

A copper-clad laminated sheet was prepared in the same manner as in Example 43, except for replacing 78 parts of the allyl ester resin (A-15) and 20 parts of n-butyl acrylate with 98 parts of the unsaturated polyester resin (a-1) as prepared in Comparative Example 1. Results of evaluations are shown in Table 21.

and dried at 120° C. for 30 minutes. The resulting paper base had a resin add-on of 15%.

The melamine-treated paper base was floated on a resin composition having the formulation shown in Table 22 below to impregnate the resin composition into the base from one side thereof.

Seven resin-impregnated bases were hot-pressed together with a copper foil MK-61 in the same manner as in Examples 28 to 30 to obtain a 1.6 mm-thick copper-clad laminated sheet.

TABLE 21

|  | Example 43 | Example 44 | Example 45 | Example 46 | Compara. Example 21 | Compara. Example 22 | Compara. Example 23 |
|---|---|---|---|---|---|---|---|
| Water Absorption (%): |  |  |  |  |  |  |  |
| E-24/50 + D-24/23 | 0.56 | 0.53 | 0.68 | 0.55 | 2.8 | 2.6 | 0.71 |
| E-24/50 + D-2/100 | 1.9 | 2.1 | 2.4 | 2.3 | 4.5 | 4.3 | 2.8 |
| Soldering Heat Resistance (sec) C-96/23/65 | 25 | 28 | 37 | 29 | 9 | 7 | 12 |
| Flexural Strength (kgf/mm$^2$) | 17.1 | 16.3 | 18.2 | 16.5 | 9.8 | 5.9 | 11.5 |
| Insulation Resistance ($\Omega$): |  |  |  |  |  |  |  |
| C-96/20/65 | $2.5 \times 10^{14}$ | $3.7 \times 10^{14}$ | $1.5 \times 10^{14}$ | $2.8 \times 10^{14}$ | $1.8 \times 10^{14}$ | $1.6 \times 10^{14}$ | $1.5 \times 10^{14}$ |
| C-96/20/65 + D-2/100 | $3.1 \times 10^8$ | $4.2 \times 10^8$ | $2.6 \times 10^8$ | $3.2 \times 10^8$ | $4.1 \times 10^5$ | $5.8 \times 10^5$ | $1.6 \times 10^5$ |

It can be seen from the results in Table 21 that a cellulose-based copper-clad laminated sheet having reduced hygroscopicity, superior electrical characteristics after water absorption as well as superior mechanical strength and heat resistance can be obtained by using cellulose fiber which has been coated with a melamine resin as a base.

According to the above-described embodiment of the metal foil-clad laminated sheet comprising an allyl ester resin, a base mainly comprising cellulose fiber, and a metal foil, both (a) hygroscopicity and (b) deterioration in electrical characteristics after water absorption are reduced while retaining superior mechanical strength and heat resistance by substantially coating the surface of cellulose fiber constituting the base with a melamine resin.

EXAMPLE 47

Preparation of Allyl Alcohol-Modified Melamine Resin Solution

In a reactor were charged 126 g (1.00 mol) of melamine, 276 g of 37% formalin (formaldehyde: 3.4 mol), and 197 g (3.4 mol) of allyl alcohol, and the mixture was reacted at 80° C. under reflux for about 3 hours. After being adjusted to a pH of 10 with sodium carbonate, the reaction mixture was cooled to room temperature and diluted with 250 g (7.8 mol) of methanol to prepare an allyl alcohol-modified melamine resin solution (1) having a solid content of 27%.

Preparation of Laminated Sheet

The allyl alcohol-modified melamine resin solution (1) was diluted with a 50% methanol aqueous solution so as to have a solid content of 15%, and kraft paper having a basis weight of 155 g/cm$^2$ and a thickness of 300 μm was dipped therein, squeezed through rollers, Results of evaluations are shown in Table 23 below.

EXAMPLE 48

Preparation of Allyl Alcohol-Modified Melamine Resin Solution

The allyl alcohol-modified melamine resin solution (1) as prepared in Example 47 was concentrated under reduced pressure of 20 mmHg to remove any unreacted allyl alcohol, and the residue was diluted with a 50% methanol aqueous solution to prepare an allyl alcohol-modified melamine resin solution (2) having a solid content of 27%.

Preparation of Laminated Sheet

A copper-clad laminated sheet was prepared in the same manner as in Example 47, except for using the allyl alcohol-modified melamine resin solution (2) in place of the solution (1). Results of evaluations are shown in Table 23.

COMPARATIVE EXAMPLE 24

A copper-clad laminated sheet was prepared in the same manner as in Example 47, except for replacing the melamine resin solution (1) with a melamine resin solution having a solid content of 15% which was prepared by dissolving a melamine resin Nica Resin S-305 in a 50% methanol aqueous solution. Results of evaluations are shown in Table 23.

COMPARATIVE EXAMPLE 25

A copper-clad laminated sheet was prepared in the same manner as in Example 47, except for using the paper base without being treated with a melamine resin solution. Results of evaluations are shown in Table 23.

TABLE 22

|  | Example 47 | Example 48 | Compara. Example 24 | Compara. Example 25 |
|---|---|---|---|---|
| Resin for Base Treatment | Allyl-modified melamine resin (1) | Allyl-modified melamine resin (2) | Nica Resin S-305 | None |

TABLE 22-continued

|  | Example 47 | Example 48 | Compara. Example 24 | Compara. Example 25 |
|---|---|---|---|---|
| Resin Composition (wt %): |  |  |  |  |
| Allyl ester resin (A-15) | 15 | 15 | 15 | 15 |
| Bromine-containing allyl ester resin (A-16) | 50 | 50 | 50 | 50 |
| 2-Ethylhexyl acrylate | 18 | 18 | 18 | 18 |
| Methyl methacrylate | 5 | 5 | 5 | 5 |
| Diallyl terephthalate | 5 | 5 | 5 | 5 |
| Trimethylolpropane triacrylate | 5 | 5 | 5 | 5 |
| Bis(4-t-butylcyclohexyl)-peroxy dicarbonate | 0.5 | 0.5 | 0.5 | 0.5 |
| Benzoyl peroxide | 0.5 | 0.5 | 0.5 | 0.5 |
| Dicumyl peroxide | 1 | 1 | 1 | 1 |
| Amount (part) of resin per 100 parts of paper | 85 | 85 | 85 | 85 |

TABLE 23

|  | Example 47 | Example 48 | Compara. Example 24 | Compara. Example 25 |
|---|---|---|---|---|
| Water Absorption (%) E-24/50 — D-24/23 (JIS C-6481) | 0.56 | 0.54 | 0.52 | 2.80 |
| Insulation Resistance ($\Omega$): |  |  |  |  |
| C-96/20/65 (JIS C-6481) | $2.5 \times 10^{14}$ | $3.6 \times 10^{14}$ | $3.8 \times 10^{14}$ | $1.6 \times 10^{14}$ |
| C-96/20/65 — D-2/100 (JIS C-6481) | $3.2 \times 10^{8}$ | $4.0 \times 10^{8}$ | $4.2 \times 10^{8}$ | $4.0 \times 10^{5}$ |
| Punchability: |  |  |  |  |
| Working Temperature (°C.) | 25-60 | 25-60 | 25-60 | 25-60 |
| Appearance | Good | Good | Cracking | Bulging |

As can be seen from the results in Table 23, laminated sheets for use in electrical parts, superior in both water resistance and punchability can be obtained by using a cellulose fiber bases which have been previously impregnated with an allyl alcohol-modified melamine resin.

EXAMPLES 49 TO 53 AND COMPARATIVE EXAMPLES 26 TO 28

Kraft paper having a basis weight of 155 g/cm² and a thickness of 300 μm was soaked in a water-methanol solution of a melamine resin S-305, air-dried, and dried at 120° C. for 30 minutes. The resin add-on was 18 parts per 100 parts by weight of the kraft paper.

The resulting melamine-treated base was dipped in a resin composition having the formulation shown in Table 24 below. Seven resin-impregnated bases were laid on each other, with an electrolytic copper foil having a thickness of 35 μm on one side of which an adhesive having the formulation shown in Table 24 had been applied to a thickness of 40 μm as an utmost layer, and the laminate was sandwiched between a pair of 50 μm-thick polyester films and hot-pressed by means of a pressing machine at 140° C. for 10 minutes under a pressure of 20 kg/cm². The laminate was further heated at 150° C. for 5 hours in a hot-air drier to obtain a copper-clad laminated sheet having a thickness of from 1.6 mm.

The results of evaluations are shown in Table 25.

TABLE 24

|  | Example No. | | | | | Compara. Example No. | | |
|---|---|---|---|---|---|---|---|---|
|  | 49 | 50 | 51 | 52 | 53 | 26 | 27 | 28 |
| Resin Composition (wt %): |  |  |  |  |  |  |  |  |
| Allyl Ester Resin (A-15) | 80 | 80 | 10 | 10 | 5 | 80 | 80 | 10 |
| Allyl Ester Resin (A-16) | — | — | 65 | 65 | 65 | — | — | 65 |
| n-Butyl Acrylate | 20 | 20 | 20 | 20 | 25 | 20 | 20 | 20 |
| Antimony Trioxide | — | — | 5 | 5 | 5 | — | — | 5 |
| Benzoyl Peroxide (part)* | 1 | 1 | 1 | 1 | 1 | 1 | 1 | 1 |
| Dicumyl Peroxide (part)* | 1 | 1 | 1 | 1 | 1 | 1 | 1 | 1 |
| Adhesive Composition (part): |  |  |  |  |  |  |  |  |
| Epoxy Resin (1)** | 100 | 60 | 60 | 60 | 60 | 60 | 60 | 60 |
| Epoxy Resin (2)*** | — | 40 | 40 | 40 | 40 | 40 | 40 | 40 |
| Polyvinyl Butyral**** | 50 | 50 | 50 | 50 | 50 | — | — | — |
| Dicyandiamine | 5 | 5 | 5 | — | — | 5 | — | — |
| 2-Phenylimidazole | 1 | 1 | 1 | — | — | 1 | — | — |
| Isophoronediamine | — | — | — | 15 | 15 | — | 15 | 15 |
| Methyl Cellosolve | 500 | 500 | 500 | 500 | 500 | 300 | 300 | 300 |

Note:
*Per 100 parts of the total amount the resin content and antimony trioxide
**Epikote 1001 available from Yuka Shell Epoxy Co., Ltd.
***Epikote 152 available from Yuka Shell Epoxy Co., Ltd.
****#6000C available from DENKI KAGAKU KOGYO K.K.

TABLE 25

| | Example 49 | Example 50 | Example 51 | Example 52 | Example 53 | Compara. Example 26 | Compara. Example 27 | Compara. Example 28 |
|---|---|---|---|---|---|---|---|---|
| Flexural Strength (JIS C-6481) (kg/mm$^2$) | 16.5 | 16.3 | 15.5 | 15.7 | 15.1 | 16.3 | 16.3 | 15.2 |
| Tracking Resistance (CTI, UL746A) (V) | >600 | >600 | >600 | >600 | >600 | >600 | >600 | >600 |
| Soldering Heat Resistance (JIS C-6481; 260° C.) (sec) | 22 | 38 | 32 | 36 | 30 | 2 | 3 | 2 |
| Peel Strength (JIS C-6481) (kg/cm) | 1.7 | 2.2 | 2.0 | 2.2 | 2.2 | 0.5 | 0.8 | 0.6 |

It was shown that copper-clad laminated sheets according to a preferred embodiment of the present invention has excellent soldering heat resistance and high peel strength of the copper foil. According to this embodiment, a copper-clad laminated sheet can be produced without using a prepreg method, and the resulting copper-laminated sheet has sperior rigidity, strength, heat resistance in soldering, and peel adhesion to copper foil.

EXAMPLES 54 TO 58 AND COMPARATIVE EXAMPLES 29 TO 31

A copper-clad laminated sheet was prepared in the same manner as in Examples 49 to 53, except for using the adhesive composition shown in Table 26 below for adhesion of a copper foil. Results of evaluations are shown in Table 27.

above-described preferred embodiment of the present invention, a copper-clad laminated sheet having superior rigidity, strength, resistance in soldering, and adhesion to the copper foil at about room and high temperatures, and on heating, can be produced without using a prepreg method.

While the invention has been described in detail and with reference to specific embodiments thereof, it will be apparent to one skilled in the art that various changes and modifications can be made therein without departing from the spirit and scope thereof.

What is claimed is:

1. A laminated sheet comprising at least one resin-impregnated fibrous base, wherein said base is impregnated with a liquid resin composition comprising at least one allyl ester resin, said allyl ester resin comprising a polybasic acid and a polyhydric alcohol, wherein an allyl ester group of said resin is bonded to at least one of the terminals of said resin.

TABLE 26

| | Example No. | | | | | Compara. Example No. | | |
|---|---|---|---|---|---|---|---|---|
| | 54 | 55 | 56 | 57 | 58 | 29 | 30 | 31 |
| Adhesive Composition (part): | | | | | | | | |
| Epoxy resin (1)* | 100 | 60 | 60 | 60 | 60 | 60 | 60 | 60 |
| Epoxy resin (2)** | — | 40 | 40 | 40 | 40 | 40 | 40 | 40 |
| Polyvinyl butyral*** | 50 | 50 | 50 | 50 | 50 | — | — | — |
| Phenolic resin**** | 25 | 25 | 25 | 25 | 25 | — | — | — |
| Dicyandiamine | 5 | 5 | 5 | — | — | 5 | — | — |
| 2-Phenylimidazole | 1 | 1 | 1 | — | — | 1 | — | — |
| Isophoronediamine | — | — | — | 15 | 15 | — | 15 | 15 |
| Methyl cellosolve | 500 | 500 | 500 | 500 | 500 | 300 | 300 | 300 |

Note.
*Epikote 1001 available from Yuka Shell Epoxy Co., Ltd.
**Epikote 152 available from Yuka Shell Epoxy Co., Ltd.
***#6000C available from DENKI KAGAKU KOGYO K.K.
****BLS 364H available from Showa Kobunshi K.K.

TABLE 27

| | Example 54 | Example 55 | Example 56 | Example 57 | Example 58 | Compara. Example 29 | Compara. Example 30 | Compara. Example 31 |
|---|---|---|---|---|---|---|---|---|
| Flexural Strength (JIS C-6481) (kg/mm$^2$) | 16.5 | 16.3 | 15.5 | 15.7 | 15.1 | 16.3 | 16.3 | 15.2 |
| Tracking Resistance (UL746A) (CTI: V) | >600 | >600 | >600 | >600 | >600 | >600 | >600 | >600 |
| Soldering Heat Resistance (JIS C-6481; 260° C.) (sec) | 23 | 45 | 36 | 41 | 38 | 2 | 3 | 2 |
| Peel Strength (JIS C-6481) (kg/cm) | 1.8 | 2.2 | 2.1 | 2.2 | 2.0 | 0.5 | 0.8 | 0.6 |
| Peel Strength (JIS C-6481; 150° C.) (kg/cm) | 0.7 | 1.2 | 1.0 | 1.1 | 1.0 | 0.3 | 0.2 | 0.2 |

As is apparent from the result in Table 27, copper-clad laminated sheet according to the present invention exhibit superior soldering heat resistance and adhesion strength of the copper foil at both about room temperature and at high temperatures. Thus, according to the 2. A laminated sheet as claimed in claim 1, wherein said resin composition further comprises a solvent, (b) said resin-impregnated fibrous base is dried to prepare a prepreg and (c) a plurality of said prepregs is hot pressed to obtain said laminated sheet.

3. A laminated sheet as claimed in claim 1, wherein said polybasic acid is selected from the group consisting of terephthalic acid, o-phthalic acid, and isophthalic acid.

4. A laminated sheet as claimed in claim 1, wherein said resin composition comprises from about 40 to 95% by weight of said allyl ester resin and from about 5 to 60% by weight of a radical polymerizable liquid crosslinking monomer, wherein said allyl ester resin is soluble in said polymeriable crosslinking monomer.

5. A laminated sheet as claimed in claim 4, wherein said radical polymerizable crosslinking monomer contains a polyfunctional crosslinking monomer in an amount of from about 1 to 30% by weight based on the total resin composition.

6. A laminated sheet as claimed in claim 5, wherein said polyfunctional crosslinking monomer has an allyl group and at least one radical polymerizable functional group, other than said allyl group, per molecule, and is in an amount of from 1 to 20% by weight based on the total resin composition.

7. A laminated sheet as claimed in claim 4, wherein said polybasic acid is selected from the group consisting of terephthalic acid, o-phthalic acid, and isophthalic acid.

8. A laminated sheet as claimed in claim 6, wherein said polyfunctional crosslinking monomer is selected from the group consisting of allyl acrylate and allyl methacrylate.

9. A laminated sheet as claimed in claim 5, wherein said polyfunctional crosslinking monomer is a polyfunctional (meth)acrylate compound.

10. A laminated sheet as claimed in claim 4, wherein said resin composition, when cured, has a glass transition temperature of from about 20 to 90° C.

11. A laminated sheet as claimed in claim 4, wherein said base substantially comprises cellulose fibers.

12. A laminated sheet as claimed in claim 11, wherein surfaces of said cellulose fibers are substantially coated with a melamine resin.

13. A laminated sheet as claimed in claim 12, wherein said melamine resin is a methylol melamine resin.

14. A laminated sheet as claimed in claim 12, wherein said melamine resin is an alkyl alcohol-modified methylol melamine resin.

15. A laminated sheet as claimed in claim 12, wherein said melamine resin is a hydroxyethyl methacrylate-modified melamine resin.

16. A laminated sheet as claimed in claim 12, wherein said melamine resin is an allyl alcohol-modified melamine resin.

17. A laminated sheet as claimed in claim 4, wherein said laminated sheet has a metal foil on the surface thereof.

18. A laminated sheet as claimed in claim 17, wherein said metal foil is a copper foil.

19. A laminated sheet as claimed in claim 18, wherein said laminated sheet and metal foil are adhered with an adhesive comprising about 100 parts by weight of an epoxy resin and from about 10 to 300 parts by weight of polyvinyl butyral.

20. A laminated sheet as claimed in claim 19, wherein said epoxy resin comprises from about 40 to 90% by weight of a bisphenol A type epoxy resin and from about 10 to 60% by weight of a novolak type epoxy resin.

21. A laminated sheet as claimed in claim 19, wherein said adhesive further comprises from about 5 to 100 parts by weight of a phenolic resin.

22. A laminated sheet as claimed in claim 21, wherein said epoxy resin comprises from about 40 to 90% by weight of a bisphenol A type epoxy resin and from about 10 to 60% by weight of a novolak type epoxy resin.

23. A laminated sheet as claimed in claim 4, wherein said radical polymerizable crosslinking monomer contains a polyfunctional crosslinking monomer.

* * * * *